US012763771B2

(12) United States Patent
Chanana et al.

(10) Patent No.: US 12,763,771 B2
(45) Date of Patent: Oct. 13, 2026

(54) MULTIPLE OR SINGLE VOLTAGE DOMAIN LOGIC GATE CIRCUITRY

(71) Applicant: Arm Limited, Cambridge (GB)

(72) Inventors: Mohit Chanana, Noida (IN); Andy Wangkun Chen, Austin, TX (US); Yew Keong Chong, Austin, TX (US); Vivek Asthana, Greater Noida (IN); Himanshu Rathore, Noida (IN); Abhishek Kumar, Noida (IN)

(73) Assignee: Arm Limited, Cambridge (GB)

( * ) Notice: Subject to any disclaimer, the term of this patent is extended or adjusted under 35 U.S.C. 154(b) by 68 days.

(21) Appl. No.: 18/789,475

(22) Filed: Jul. 30, 2024

(65) Prior Publication Data

US 2026/0039299 A1 Feb. 5, 2026

(51) Int. Cl.
*H03K 19/0175* (2006.01)
*H03K 19/20* (2006.01)

(52) U.S. Cl.
CPC ..... *H03K 19/017509* (2013.01); *H03K 19/20* (2013.01)

(58) Field of Classification Search
CPC ....................... H03K 19/017509; H03K 19/20
See application file for complete search history.

(56) References Cited

U.S. PATENT DOCUMENTS

| | | | | |
|---|---|---|---|---|
| 6,487,687 | B1 * | 11/2002 | Blake | H03K 17/08142 714/724 |
| 7,795,916 | B2 * | 9/2010 | Aoki | H03K 3/35613 327/333 |
| 2001/0011910 | A1 | 8/2001 | Tanaka et al. | |
| 2002/0083352 | A1 | 6/2002 | Fujimoto et al. | |
| 2005/0195012 | A1 * | 9/2005 | Sueoka | H03K 3/356182 327/333 |
| 2008/0143417 | A1 * | 6/2008 | Campbell | H03K 3/012 327/333 |
| 2015/0070069 | A1 * | 3/2015 | Kossel | H03K 19/018507 327/333 |

FOREIGN PATENT DOCUMENTS

| | | |
|---|---|---|
| JP | H02180426 A | 7/1990 |
| JP | 2014179777 A | 9/2014 |

OTHER PUBLICATIONS

Combined Search and Examination Report under Sections 17 and 18(3), App. No. GB2511911.6, Mailed Nov. 26, 2025, 15 pages.
Response to Combined Search & Examination Report under Sections 17 & 18(3), Filed May 19, 2026, 17 pages.

* cited by examiner

*Primary Examiner* — Daniel D Chang
(74) *Attorney, Agent, or Firm* — Berkeley Law & Technology Group, LLP

(57) ABSTRACT

Briefly, example apparatuses, articles of manufacture, and/or techniques are disclosed that may be implemented, in whole or in part, to implement, facilitate and/or support integrated circuits comprising Boolean logic gate circuitry and corresponding voltage level shifting circuitry.

20 Claims, 10 Drawing Sheets

MULTIPLE OR SINGLE VOLTAGE DOMAIN LOGIC GATE CIRCUITRY

FIELD

The present disclosure relates generally to integrated circuitry, and more particularly, level shifting circuitry.

BACKGROUND

Integrated circuits (ICs) may utilize multi-voltage techniques where portions of an IC are partitioned into various voltage domains (e.g., logic levels). Multiple voltage domains may be used to various purposes, such as, for example, balancing power and performance characteristics. For instance, a first portion having higher performance requirements might be operated in a higher voltage domain while a second portion having lower performance requirements might be operated in a lower voltage domain. As another example, a first portion of a circuit might be continuously powered while a second portion might be variably powered. For instance, core circuitry of a RAM memory device (e.g., the memory storage cells and associated circuitry) might be powered continuously to retain their stored state while peripheral circuitry (e.g., read/write circuitry, etc.,) may be de-powered (e.g., via power gating) when not needed. As a further example, a circuit may include internal and external voltage domains. For instance, external voltage domains may be regulated by an external voltage regulator while internal voltage domains may be regulated by an interior voltage regulator.

BRIEF DESCRIPTION OF THE FIGURES

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1:
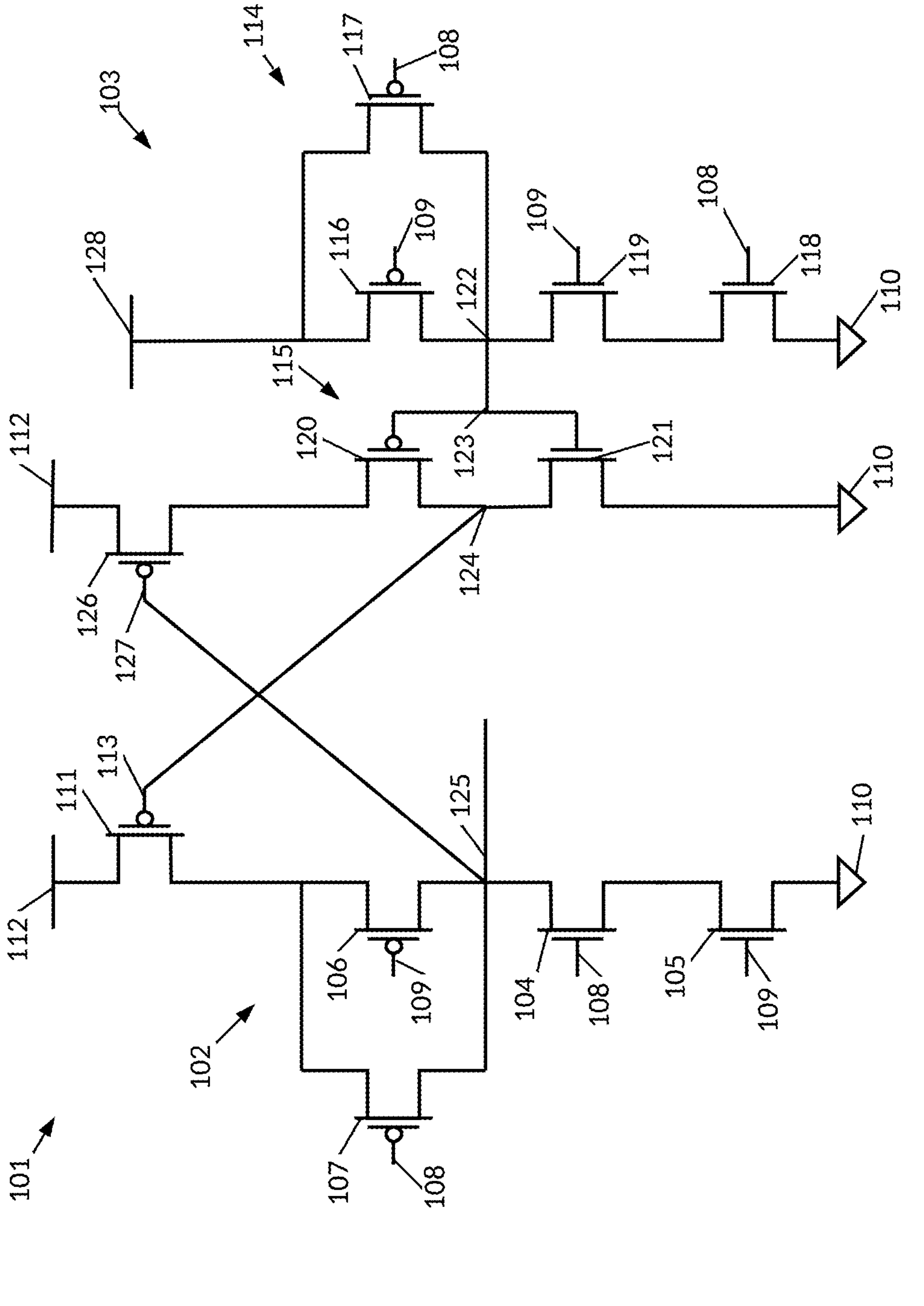
FIG. 1 illustrates an example apparatus including a logic gate circuit in accordance with an implementation.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others, one or more aspects, properties, etc. may be omitted, such as for ease of discussion, or the like. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. Therefore, the following detailed description is not to be taken to limit claimed subject matter and/or equivalents.

DETAILED DESCRIPTION

References throughout this specification to one implementation, an implementation, one embodiment, an embodiment, and/or the like means that a particular feature, structure, characteristic, and/or the like described in relation to a particular example, implementation and/or embodiment is included in at least one example, implementation and/or embodiment of claimed subject matter. Thus, appearances of such phrases, for example, in various places throughout this specification are not necessarily intended to refer to the same implementation and/or embodiment and/or to any one particular implementation and/or embodiment. Furthermore, it is to be understood that particular features, structures, characteristics, and/or the like described are capable of being combined in various ways in one or more implementations and/or embodiments and, therefore, are within intended claim scope. Unless explicitly indicated to the contrary, reference to "another example" and/or "a further example" does not indicate that the described example is an exclusive alternative to a preceding example. In general, such examples may be alternatives to and/or additions to previous examples.

ICs may include level shifter circuitry to translate signals between different voltage domains. Level shifting using conventional level shifting circuits may delay signals by one or more execution stages. For instance, a conventional contention mitigation level shifter (CMLS) may add a two stage signaling delay to translate between voltage domains. Additionally, reconfiguring and/or removing conventional level shifter circuitry may introduce complications when reusing circuitry designs in ICs with different voltage levels or a single voltage domain.

Aspects of the disclosed technology may provide level shifting circuitry that addresses challenges such as these examples. For example, some implementations of the disclosed technology may bridge multiple voltage domains without introducing signaling delay for critical path signals. As another example, some design implementations may be used in various multi-voltage and/or single domain ICs without substantial reconfiguration.

In some implementations, the level shifting circuitry may include a first logic gate having an input in a first voltage domain and an output in a second voltage domain. The level shifting circuit may further include a second logic gate circuit of a complementary type to the first logic gate circuit. In some implementations, the second logic gate circuit may have an input connected to the same signal line as the first logic gate circuit and an output connected to a header control signal line. The circuit may further include a first header transistor connected to the header control signal line to switchably couple an output voltage rail to the first logic gate circuit and a second header transistor connected to the output signal line to switchably couple the output voltage rail to the second logic gate circuit.

In some implementations, this configuration may provide level shifting for signaling paths without incurring delay in certain signal state transitions, such as pull-down to a low voltage state. In further implementations, level shifting circuitry may include bypass circuitry that may bypass level shifting in response to a bypass signal, for example, fix the first header transistor in a conducting state. For example, a bypass control signal may be implemented in circuits in a single voltage domain or when the voltage difference between domains is sufficiently small.

Further aspects of the disclosed technology may provide a method of operating level shifting circuitry. In some implementations, a method may include receiving an input signal in a first voltage domain at a first logic gate circuit and operating the first logic gate circuit to perform a first type of Boolean function on the input signal to generate an output signal in a second voltage domain. The method may further include receiving the input signal at a second logic gate circuit and operating the second logic gate circuit to perform a second type of Boolean function on the input signal to generate a header control signal. In some implementations, the second type of Boolean function may be a complementary type to the first type of Boolean function. The method may further include receiving the output signal at a first header gate of a first header transistor to control power supplied to the second logic gate circuit, and receiving the header control signal at a second header gate of a second header transistor to control power supplied to the first logic gate circuit.

Still further aspects of the disclosed technology may provide computer-readable medium storing computer-readable code for the fabrication of an apparatus as described above and/or an apparatus to function as described above.

FIG. 1 illustrates an example implementation of level shifting circuitry 101 including a first logic gate circuit 102 and a second logic gate circuit 103. In the illustrated example, the first logic gate 102 comprises a two-input NAND (NAND2) gate and the second logic gate 103 comprises a two-input AND (AND2) gate (comprising a NAND2 gate 114 and an inverter 115). In further implementations, level shifting circuitry 101 may comprise other Boolean logic gates, such as, for example, NOR gates, OR gates, AND gates, OR-AND Invert (OAI) gates, AND-OR-Invert (AOI) gates, XOR gates, XNOR gates, combinations thereof, and/or the like. Additionally, the illustrated circuitry 101 is implemented via a CMOS (Complementary Metal-Oxide-Semiconductor) design employing complementary p-type and n-type MOSFETs (Metal-Oxide-Semiconductor Field-Effect Transistors). Further examples may be implemented using any suitable logic family technology, such as, for example, Magento-Electric Spin-Orbit (MESO) logic, tunnel FETs, spintronics, etc. . . . .

As indicated above, level shifting circuitry 101 may comprise a first logic gate circuit 102 to implement a first type of Boolean function and a second logic gate circuit to implement a second type of Boolean function complementary to the first. The complementary functions may be logical inverses of each other. For example, pairs of complementary functions may include AND, NAND; OR, NOR; AOI, OAI; etc. . . . . In the illustrated implementation, first logic gate circuitry 102 may comprise a NAND2 gate and second logic gate circuitry 103 may comprise an AND2 gate.

In some implementations, the circuits may have equivalent inputs, for example, both circuits 101, 102 may operate on the same input signals 109, 108. In further implementations, the circuits may have differing inputs as described with respect to the subsequent figures.

In a CMOS NAND2 implementation as illustrated, first logic gate circuit 102 may comprise a first pMOS header transistor 111, pMOS transistors 106, 107, nMOS transistors 104, 105 connected to a high voltage rail (Vddc) 112 and a low voltage rail (e.g., Vcc/GND or "ground") 110. For ease of explanation, circuits may be described with respect to level shifting up from a peripheral voltage domain (Vddp) to a a core voltage domain (Vddc). However, these terms are explanatory only and implementations of described technology may be used to level shift between any two voltage domains, as well as in ICs in a single voltage domain (e.g., with a single Vdd voltage). For instance, the two voltage domains may be external voltage domain and an internal voltage domain. Additionally, examples may be described with respect to active high signaling where a logical 1/TRUE state is represented by a high voltage state and a logical 0/FALSE state is represented by a low voltage state. Of course, further implementations may employ active low signaling with corresponding changes to the circuit layouts.

In some implementations, NAND2 102 may comprise complementary transistor pairs 104, 107; 105, 106 coupled to input signal lines 108, 109, respectively, to perform a Boolean NAND operation on signals received via signal lines 108, 109. In some implementations, input signal lines 108, 109 may be coupled to a voltage domain other than Vddc 112, such as a peripheral voltage domain (Vddp) (e.g., signal lines 108, 109 may have logic voltage levels different than provided by Vddc 112). In some particular implementations, input signals on lines 108 and 109 are at a lower voltage domain than Vddc 112. For example, input lines 108 and 109 may be in a Vddp voltage domain. In further implementations, input signal lines 108 and 109 may be in Vddc 112 voltage domain or circuit 101 may comprise a single voltage domain (e.g., Vdd), such as, for example, implementations described with respect to FIGS. 4, 6-8.

In the illustrated example, NAND2 102 includes pMOS transistors 106, 107 connected in parallel with their sources connected to a drain of pMOS header transistor 111 and their drains connected to a circuit signal output 125 ("signal output 125"). NAND2 102 further includes nMOS transistors 104, 105 connected in series with a first drain (e.g. of transistor 104) connected to the output and a second source (e.g. of transistor 105) connected to Vcc 110. The gates of cMOS transistor pair 104, 107 are connected to first input signal line 108 and the gates of cMOS transistor pair 105, 106 are connected to second input signal line 109. Accordingly, a high voltage signal (e.g., a 1) received via input signal line 108 may close nMOS 104 and open pMOS 107 while a low voltage signal (e.g., a 0) may open nMOS 104 and close pMOS 107. Similarly, a high voltage signal (e.g., a 1) received via input signal line 109 may close nMOS 105 and open pMOS 106 while a low voltage signal (e.g., a 0) may open nMOS 105 and close pMOS 106. A binary NAND function on two operands is 0 when and only when both operands are 1, and is otherwise 0. As illustrated, NAND2 102 implements this type of Boolean function because signal output 125 is coupled to Vcc 110 (e.g., to output a 0 signal) when both transistors 104 and 105 are closed and both transistors 106, 107 are open, which occurs when and only when both signal inputs 108, 109 are in the 1 state. Otherwise, a 0 at either or both of transistor pairs 104, 107; 105,

106 decouples output 125 from Vcc and couples output 125 to Vddc 112 (e.g., to output a 1 signal).

NAND2 102 may be connected to Vddc 112 via an intermediary header transistor 111. Header transistor 113 may have a gate connected to a header control signal output 124 ("header output 124") of a complementary type logic gate circuit 103. In the illustrated example, complementary type logic gate circuit 103 comprises an AND2 circuit 103 (e.g., a 2 input AND gate). Accordingly, in the illustrated example, the complementary function types comprise a NAND function and an AND function. In some implementations, such as illustrated example 101, logic gates 102 and 103 may act on common signals 108, 109, where the Boolean functions executed by logic gates 102 and 103 are complements of each other, e.g., $B(i_1, \ldots, i_n)$, $B(i_1, \ldots, i_n)$, where B is the Boolean function of one gate and B complement is the function of the other gate acting on common operands $i_1, \ldots, i_n$ ($i_n$ the illustrated example, n=2). In further implementations, logic gates 102 and 103 may act on different input signals, where the Boolean functions executed by logic gates 102 and 103 are of complementary type, e.g., $B_{t1}(i_1, \ldots, i_n)$, $B_{t2}(i_a, \ldots, i_c)$, where $B_{t1}$, $B_{t2}$ are complementary types of Boolean functions (e.g., AND and NAND, OR and NOR, XOR and XNOR, etc.) operands $(i_1, \ldots i_n)$, $(i_a, \ldots, i_c)$ represent operands that may include operands in common and/or operands unique to one function or the other.

In some implementations, complementary logic gate circuit 103 may comprise a logic gate 114 that is of the same type as logic gate 102 and an inverter 115 having an input 123 connected to an output 122 of logic gate 114. For instance, $i_n$ the illustrated example, logic gate 114 comprises a NAND2 gate 114. In some implementations, logic gate 114 may be coupled to a second voltage rail 128. For instance, voltage rail 128 may be in a different voltage domain than rail 112. In some implementations, input signal lines 108, 109 are in the same voltage domain as voltage rail 128 (e.g., Vddp). In further implementations, voltage rails 112 and 128 may connections to a common voltage domain, such as, for example, in a single domain implementation.

In the illustrated example, logic gate 114 may comprise a NAND2 gate 114. For example, NAND2 114 may be arranged similarly to NAND2 102 and may comprise cMOS transistor pairs 117, 118; 116, 119, which may be connected in a circuit and may have gates connected to input signal lines 108, 109 as described with respect to cMOS transistor pairs 107, 104; 106, 105, respectively. In particular, NAND2 114 may comprise a pair of pMOS transistors 116, 117 connected in parallel and a pair of nMOS transistors connected in series 119, 118 with an output 122 at a node between the pMOS pair 116, 117 and nMOS pair 118, 119. In some implementations, second voltage rail 128 may permit use of relatively smaller transistors in logic gate circuitry 114 compared to logic gate circuitry 102, which may reduce the area of logic gate circuitry 114 relative to logic gate circuitry 102.

In some, the Boolean function of the complementary type may result from performing a Boolean NOT on a Boolean function of the same type. For example, logic gate circuit 103 may further comprise an inverter 115 having a signal input 123 and a header control signal output 124. Inverter 115 may perform a Boolean NOT operation on an input signal received at input 123 to generate a header control signal at output 124. Accordingly, logic gate circuit 103 may perform a Boolean AND function on input signals X, Y as AND(X,Y)=NOT (NAND(X,Y)). In some cMOS implementations, such as the illustrated implementation, inverter 115 may comprise a pair of cMOS transistors 120, 121 having drains and sources connected in series with Vddc 112, a header transistor 126, and Vcc 110. Accordingly, inverter 115 is in a different voltage domain than NAND2 114 (e.g., Vddc vs. Vddp).

In some implementations, example circuit 101 may further comprise a first header transistor 111 to switchably couple Vddc 112 to NAND2 102 via a first header gate 113 connected to header output 124. As discussed above, in the illustrated example, when signal output 125 is in a high voltage state (e.g., a 1), header output 124 is in a low voltage state (e.g., a 0) and vice versa. Transistor 111 may couple NAND2 102 to Vddc 112 when closed (e.g., when the header output signal is high) and may decouple NAND2 102 from Vddc 112 when open (e.g., when the header output signal is low).

In some implementations, example circuit 101 may further comprise a second header transistor 116 to switchably couple Vddc 112 to logic gate circuitry 103 via a second header gate 127 connected to signal output 125. In some implementations, portions of logic gate circuitry may be in different voltage domains. In some such implementations, some of the portions may remain coupled to their respective voltage rails when second header transistor 116 decouples logic gate circuitry 103 from Vddc. For instance, as illustrated, inverter 115 is in the Vddc domain while AND2 is in the Vddp domain. Accordingly, when output signal line 125 is in a low state, second header transistor 126 is opened and prevents current flow from Vddc, setting header control signal output 124 to the low state (Vcc).

As a particular hypothetical to illustrate level shifting operation, example circuit 101 may output an inverted clocked select signal (nclk_sel) on signal output 125 (for instance, as a row clock signal for row select circuitry of a memory device), where signal line 108 may carry a pulsed signal, such as a clock signal clk_in while signal line 109 may carry a steady-state select signal, sel_in. In this example, circuit 101 may further comprise an inverter (not pictured) connected to output 125 to invert nclk_sel to generate a clocked select signal, clk_sel. In this example, when sel_in=1, while clk_in alternates between 1 and 0 output 125, transistors 107 and 105 alternately open and close and output 125 outputs a pulsed nclk_sel. When sel_in=0, transistor 109 remains conductive and output 125 is coupled to voltage rail 112 in a steady state and nclk_sel=1 (e.g., clk_sel=0 in a steady state). The header control signal (hc) is the opposite of nclk_sel, accordingly when nclk_sel=1, hc=0 and first header transistor 111 is conductive while the second header transistor 126 is non-conductive and when nclk_sel=0, hc=1 and first header transistor 111 is nonconductive while the second header transistor 126 is conductive. Accordingly, the gates of circuit 101's input transistors 106, 107, 104, 105 may be in a lower voltage domain than voltage rail 112 because header transistor 111 decouples the transistors 106, 107, 104, 105 when they are non-conductive. This may prevent a voltage from occurring across the transistors 104-107 when they are in a nonconductive state, which may enable signals from a lower voltage domain to drive transistors sized for a higher voltage domain.

In some implementations, voltage level shifting with respect to different output state transitions may incur different delays. For example, in the illustrated implementation, the voltage pull-down to transition output 125 from an active signal (e.g., a pulsed output signal or a steady 1 state) to an inactive signal (e.g., a steady 0 state) may occur at relatively the same time as a single domain NAND2 without level shifting circuitry 103, 111. In comparison, transitioning from an inactive signal to an active signal may include a stage penalty comparable to a CMLS. Accordingly, the average stage delay may be relatively lower than a comparable CMLS. Additionally, if a critical signaling path involves an active to inactive transition, then the critical signaling path might not be affected by the level shifting operation. For instance, in the above hypothetical, it may be desirable for clk_sel to transition from inactive (e.g., 0) to active (e.g., pulsed 1) as quickly as possible. For example, clk_sel might be a clocked row select signal of a memory device. This transition corresponds to the transition of nclk_sel (e.g., output 125) from active to inactive. Accordingly, the illustrated circuit 101 may generate a critical path signal transition without a stage delay relative to a non-level shifted version.

Figure 2:
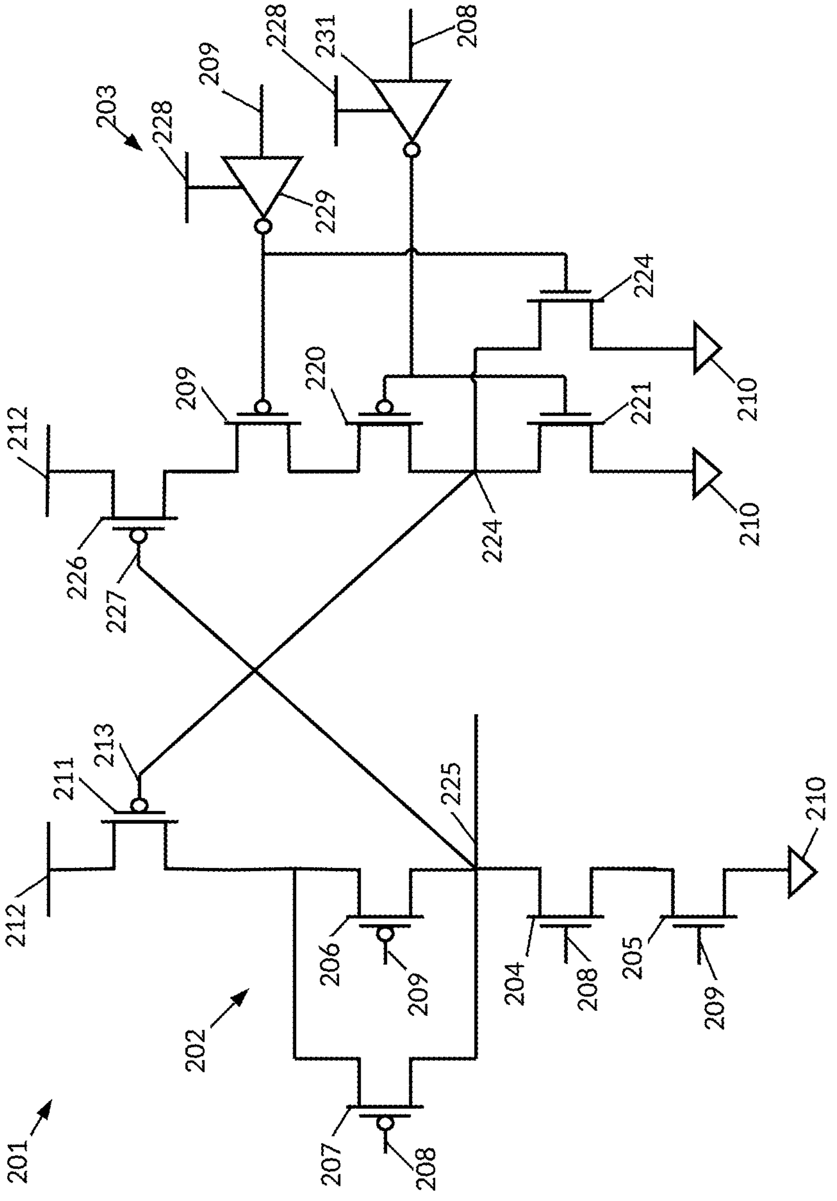
FIG. 2 illustrates another example apparatus including a logic gate circuit in accordance with an implementation.

Attention is now drawn to FIG. 2, which illustrates a further example circuit 201 to implement a level shifted NAND2 operation on input signals received on signal lines 208, 209. For example, input signal lines 208, 209 may be in a first voltage domain while output signal line 225 may be in a second voltage domain.

As illustrated, example circuit 201 may comprise a logic gate circuit 202 and a complementary type logic gate circuit 203. In the illustrated example, logic gate circuit 202 may be a NAND2 gate as described with respect to logic gate circuit 102 of FIG. 1. For example, in a cMOS implementation, logic gate circuit 202 may comprise complementary transistor pairs 204, 207; 205, 206. In some examples, transistors 204-207 may comprise pMOS transistors 207, 206 and nMOS transistors 204, 205 coupled to input signal lines 208, 209, respectively. In some implementations, pMOS transistors 207, 206 may be connected to a voltage rail 212 and a signal output 225 in parallel, while nMOS transistors 204, 205 may be connected to signal output 225 and a ground 210 in series. In this arrangement, logic gate circuit 202 may output 225 a signal resulting from a NAND operation on signals received via 208, 209.

Example circuit 201 may further comprise a complementary type logic gate circuit 203 having inputs coupled to signal lines 208, 209 and an output 224 coupled to gate 213 of header transistor 211. In some implementations, logic gate circuit 203 may comprise an AND2 gate 203 as a complementary type gate to NAND2 gate 202. For example, AND2 gate 203 may operate on input signals received via lines 208, 209 as discussed with respect to AND2 gate 103 of FIG. 1. In this example, AND2 gate 203 may comprise inverters 229, 231 having inputs connected to signal lines 209, 208, respectively. In some implementations, inverters 229, 231 may be connected to a second voltage rail 228. For example, second voltage rail 228 may be in the same voltage domain as signal lines 209, 208.

In some implementations, AND2 gate 203 may further comprise NOR2 circuitry comprising a first cMOS pair 209, 224 having gates connected to the output of inverter 229 and a second cMOS pair 220, 221 having gates connected to the output of inverter 231. For instance, the NOR2 circuitry may comprise pMOS transistors 209, 220 connected to voltage rail 212 and header control signal output 224 in series and nMOS transistors 221, 224 connected to header control signal output 224 and ground 210 in parallel. Accordingly, the AND2 gate 203 may perform a Boolean AND function on signals X, Y as AND(X,Y)=NOR(NOT(X),NOT(Y)).

Example circuit 201 may further comprise a first header transistor 211 and a second header transistor 226. In some implementations, first header transistor 211 may switchably couple NAND2 202 to voltage rail 212 responsive to a header control signal receive via output 224. For example, first header transistor 211 may comprise a pMOS transistor having a source connected to voltage rail 212, a drain connected to NAND 202, and a gate connected to header control signal output 224. In some implementations, second header transistor 226 may switchably couple AND2 203 to voltage rail 212 responsive to a NAND2 output signal received via output 225. For example, second header transistor 226 may comprise a pMOS transistor having a source connected to voltage rail 212, a drain connected to AND2 203, and a gate connected to signal output 225. Header transistors 211, 226 may be otherwise implemented as described with header transistors 111, 126 of FIG. 1, respectively.

Figure 3:
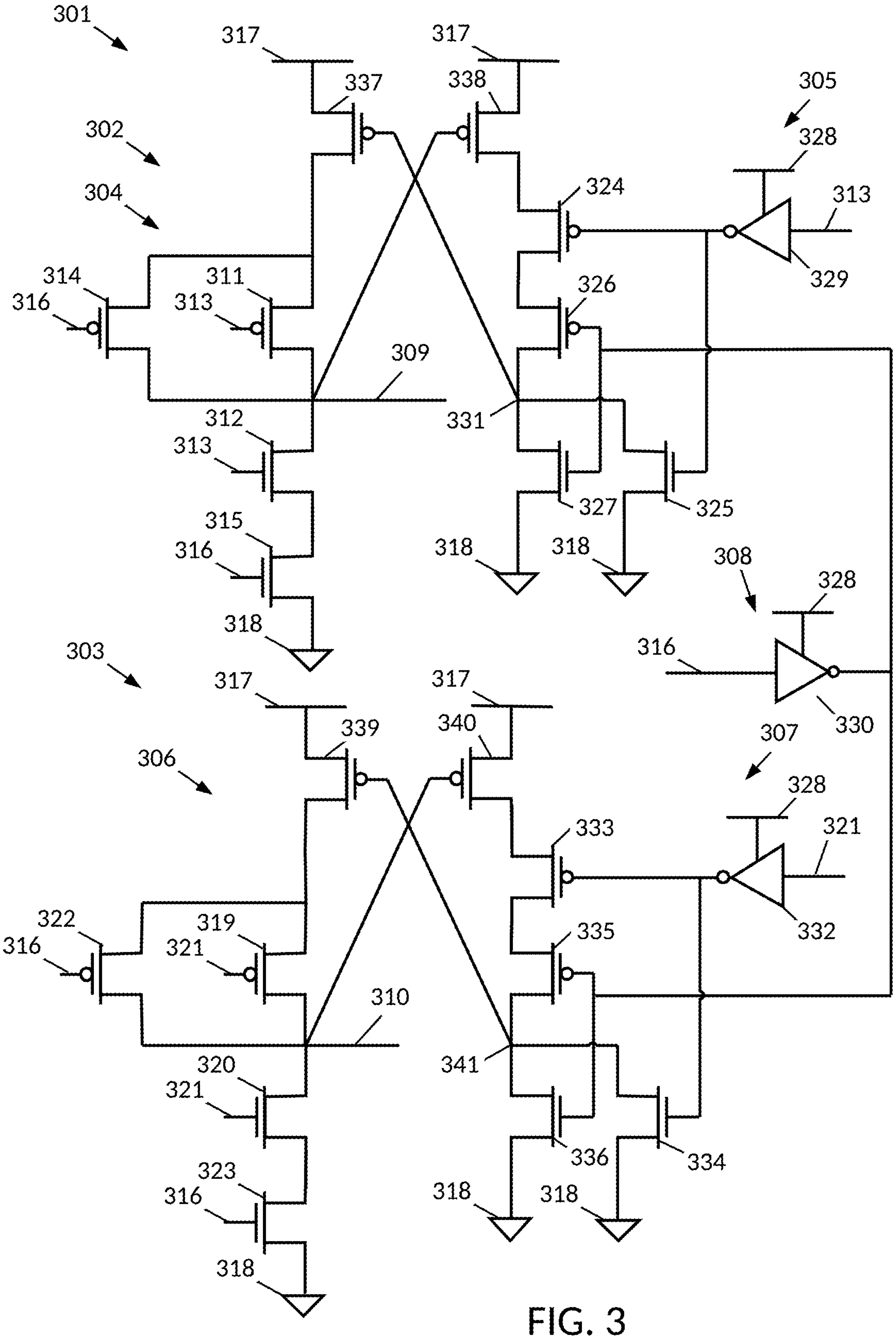
FIG. 3 illustrates another example apparatus including a logic gate circuit in accordance with an implementation.

In some implementations, multiple logic gates may share portions of their respective complementary type logic gates. FIG. 3 illustrates an example of such an implementation, comprising a plurality of level shifting circuits 302, 303 comprising logic gates 304, 306 and complementary type gates 305, 307 sharing circuitry 308. In particular, in this example, logic gates 304, 306 may comprise NAND2 gates 304, 306 while complementary type logic gates 305, 307 may comprise AND2 gates 305, 307. In further implementations, any number of circuits 302, 303 may share level shifting circuitry 308, different circuits 302, 303 may comprise different types of logic gates 304, 306 (e.g., a NAND gate and a NOR gate may share circuitry 308), and/or other like combinations may be implemented; for instance, a subset of circuits 302, 303 may include bypass circuitry as described below.

In some implementations, NAND2 gate 304 may be implemented as described with respect to NAND2 102 and/or NAND2 202 of FIGS. 1, 2, respectively. For example, NAND2 304 may comprise a first cMOS pair 311, 312 connected to a first input signal line 313 and a second cMOS pair 314, 315 connected to a second input signal line 316. In this example, pMOS transistors 311, 314 are connected to a voltage rail 317 and signal output 309 in parallel, while nMOS transistors 312, 315 are connected to a ground 318 and signal output 309 in series. Similarly, in some implementations, NAND2 gate 306 may be implemented as described with respect to NAND2 102 and/or NAND2 202 of FIGS. 1, 2, respectively. For example, NAND2 306 may comprise a first cMOS pair 319, 320 connected to a first input signal line 321 and a second cMOS pair 322, 323 connected to input signal line 316. In this example, pMOS transistors 319, 322 are connected to a voltage rail 317 and signal output 310 in parallel, while nMOS transistors 320, 323 are connected to a ground 318 and signal output 309 in series.

In some implementations, example circuit 301 may further comprise a first AND2 gate 305 as a complementary type gate to NAND2 304 and a second AND2 gate 307 as a complementary type gate to NAND2 306. In the illustrated example, AND2 gate 305 and AND2 gate 307 may be implemented as described with respect to AND2 gate 203 of FIG. 2. For example, AND2 305 may comprise a pair of inverters 329, 330 connected to input signal lines 313, 316, respectively. AND2 305 may further comprise a pair of cMOS transistor pairs 324, 325; 326, 327 connected in a NOR2 arrangement to outputs of inverters 329, 330, respectively. For example, AND2 305 may comprise pMOS transistors 324, 326 connected to voltage rail 317 and a header control signal output 331 in series and nMOS transistors 325, 327 connected to header control signal output 331 and ground 318 in parallel. Continuing the example, AND2 gate 307 may comprise a pair of inverters 332, 330 connected to input signal lines 321, 316, respectively. AND2 305 may further comprise a pair of cMOS transistor pairs 333, 334; 335, 336 connected in a NOR2 arrangement to outputs of inverters 332, 330, respectively. For example, AND2 307 may comprise pMOS transistors 333, 335 connected to voltage rail 317 and a header control signal output 341 in series and nMOS transistors 334, 336 connected to header control signal output 341 and ground 318 in parallel.

In some implementations, circuitry portions 308 shared between complementary type gate circuits 305, 308 may include signal inputs 316 for one or more signals shared between logic gate circuits 304, 306. For instance, in the illustrated example, inverter 330 and signal input 316 are shared between AND2 305 and AND2 307. Accordingly, AND2 gate 305 may perform a Boolean AND(X,Y) operation on signals X,Y received on signal lines 313, 316, respectively. Similarly, AND2 gate 307 may perform a Boolean AND(Z,Y) operation on signals Z,Y received on signal lines 321, 316, respectively. For instance, to continue the earlier example of a circuit to generate a row clock signal, signal line 316 may carry a pulsed signal input, such as a clock signal and signal lines 313, 321 may carry row select signals corresponding to different rows of a memory device. Accordingly, in this example, output 309 may carry a first row select clock signal responsive to a first row select signal received via line 313 and output 310 may carry a second row select clock signal responsive to a second row select signal received via line 321, where both row select signals share a common pulse frequency from the clock signal received via line 316. In some implementations, shared level shifting circuitry 308 may have relatively reduced loading on corresponding signal lines 316 compared to an implementation where portion 308 is replicated for each gate 305, 308.

In some implementations, example circuit 301 may further comprise a first pair of header transistors 337, 338 to switchably couple logic gates 304, 305 to voltage rail 317, respectively. Header transistor 337 may have a gate connected to a header control signal 331 and header 338 may have a gate connected to output 309. Similarly, example circuit 303 may further comprise a second pair of header transistors 339, 340 to switchably couple logic gates 306, 307 to voltage rail 317, respectively. Header transistor 339 may have a gate connected to a header control signal output 341 and header 340 may have a gate connected to output 310. For example, example circuit 302 may have inputs 313, 316 in a first domain (e.g., voltage rail 328) and an output 309 in a second domain (e.g., voltage rail 317) and may operate as described above with respect to circuits 101, 201. Similarly, example circuit 303 may have inputs 321, 316 in the first domain and an output 310 in a second domain and may operate as described with respect to circuits 101, 201. In further implementations, portions of circuit 301 may be powered by different voltage domains. For example, in some implementations, inverters 329, 330, 332 may be connected to voltage rail 328 in a different voltage domain than voltage rail 327. For instance, voltage rail 328 may be in the same voltage domain as signal lines 313, 316, 321.

Figure 4:
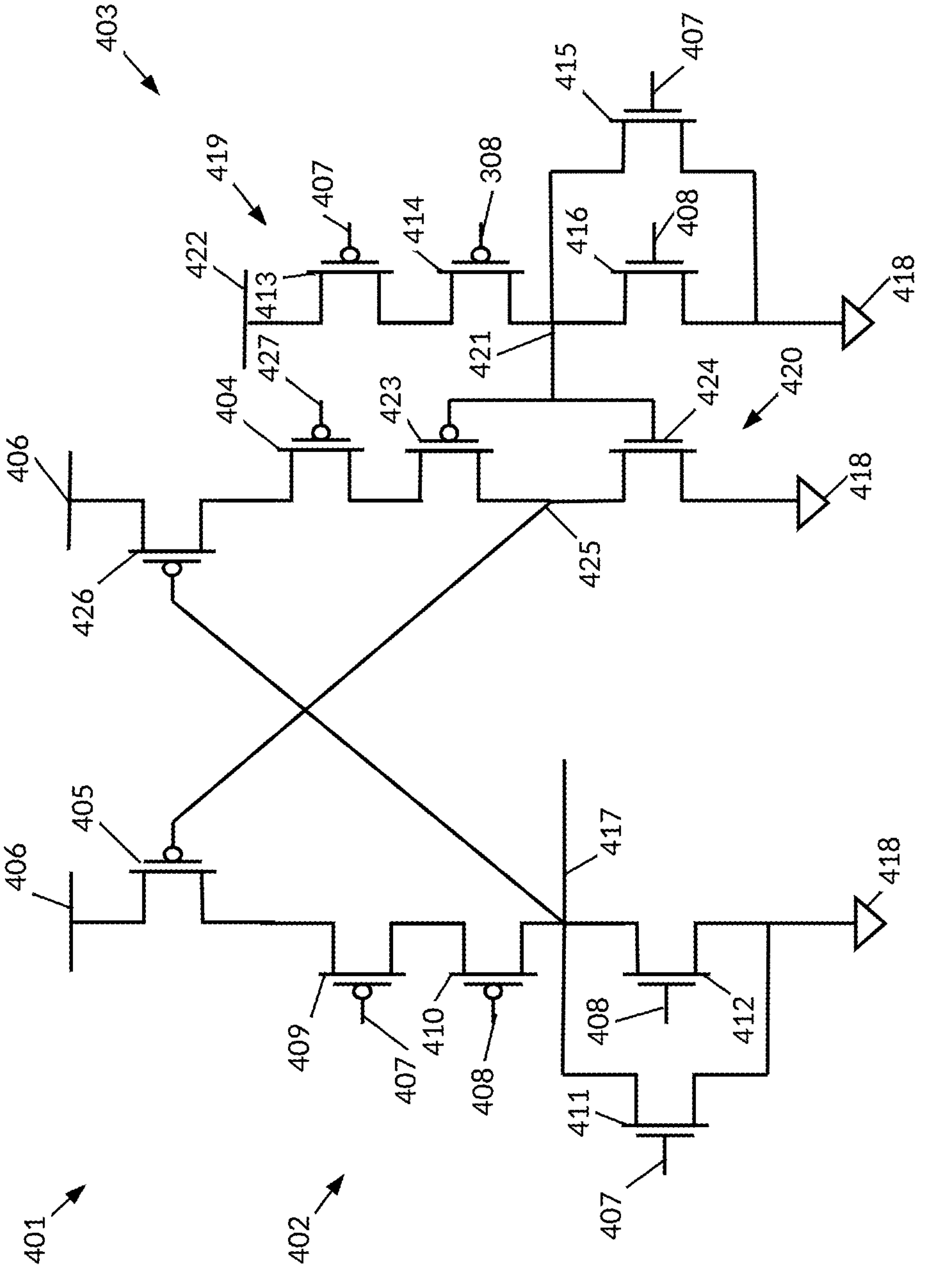
FIG. 4 illustrates another example apparatus including a logic gate circuit in accordance with an implementation.

Attention is now drawn to FIG. 4, which illustrates an example circuit 401 including bypass circuitry 404. For instance, circuit 401 may comprise a circuit as described with respect to circuits 101, 201, 302, 303, as described with respect to FIGS. 1-3. Circuit 401 may further comprise bypass circuitry 404, which may place a first header 405 in a fixed conductive state responsive to a bypass control signal, such that the first logic gate circuitry 402 is continuously coupled to a voltage rail 406. Example circuit 401 includes a NOR2 gate 402 and a complementary OR2 gate 403 having inputs connected to common signal lines 407, 408. Of course, further implementations may include other logic gate circuitry to implement other Boolean function and/or the complementary gate 403 may have different inputs.

In some implementations, NOR2 402 may be implemented in cMOS and may include, for example, complementary transistor pairs 409, 411 having gates connected to a first input signal line 407 and complementary transistor pairs 410, 412 having gates connected to a second input signal line 408. In some implementations, NOR2 circuitry 402 may include pMOS transistors 409, 410 connected to voltage rail 406 and a signal output 417 in series. NOR2 circuitry 402 may further include nMOS transistors 411, 412 connected to signal output 417 and Vcc 418 in parallel. In some implementations, transistors 409-412 may otherwise be as described with respect to transistors 104-107. Accordingly, in some implementations, input signal lines 407, 408 may be in different voltage domains than voltage rail 406. In further implementations, input signal lines 407 408 may be in the same voltage domain as voltage rail 406.

Example circuitry 401 may further comprise a complementary type logic gate circuit 403. For example, in the illustrated implementation, logic gate 403 may comprise a two-input OR gate (OR2) 403, having a complementary type to the NOR2 402. In some implementations, OR2 403 may comprise an inverted NOR2 gate, comprising NOR2 circuitry 419 connected to an inverter circuit 420. For example, NOR2 circuitry may be implemented similarly to NOR2 402. For example, NOR2 419 may comprise cMOS pairs 413, 415; 414, 416, where pair 413, 415 have gates connected to input signal line 407 and pair 414, 416 have gates connected to input signal line 408. In some implementations, NOR2 circuitry 419 may include pMOS transistors 413, 414 connected to a voltage rail 422 and a NOR2 output/inverter input node 421 in series. NOR2 circuitry 419 may further include nMOS transistors 415, 416 connected to output/input node 421 and Vcc 418 in parallel. In some implementations, transistors 413-416 may otherwise be as described with respect to transistors 116-119. In some implementations, inverter 420 may be implemented as describe with respect to inverter 115. For example, inverter 420 may comprise a signal input connected to the output of the NOR2 gate 419 (e.g., node 421). Inverter 420 may further comprise a header control signal output 425. Inverter 420 may perform a Boolean NOT operation on an input signal received at node 421 123 to generate a header control signal at output 425. In some cMOS implementations, such as illustrated, inverter 420 may comprise a pair of cMOS transistors 423, 424 having drains and sources connected in series with voltage rail 406, a header transistor 426, a bypass transistor 404, and Vcc 418. In some implementations, voltage rail 422 may be in a different voltage domain than voltage rail 406, while in further implementations, voltage rail 422 may be in the same voltage domain as voltage rail 406.

Example circuit 401 may further comprise header transistors 405, 426, where a gate of a first header transistor 405 is connected to a header control signal output 425 and a gate of a second header transistor 426 is connected to signal output 417. In some implementations, header transistors 405, 466 may operate as described with respect to header transistors 111, 126, respectively, to couple and decouple gate circuit 402 and complementary gate circuit 403 from voltage rail 406 based on output signals received via output 417 and header control signals received via header control signal output 425.

Example circuit 401 may further comprise bypass circuitry, such as a bypass transistor 404. In some implementations, bypass transistor 404 may be connected in series between voltage rail 406 and inverter circuit 420. For example, bypass transistor 404 may comprise a pMOS transistor 404 having a gate connected to a bypass signal line 427. In this example, bypass transistor 427 is placed into a non-conductive state in response to a high-voltage signal (e.g., a logical 1) on bypass signal line 427. Accordingly, responsive to a bypass signal, bypass transistor 404 may decouple inverter 420 from voltage rail 406, which may fix header control output 425 to a low voltage (logical 0) state. The low voltage at header control output 425 may thus fix header transistor 405 into a steady conductive state. Similarly, in response to a low-voltage signal on bypass signal line 427, bypass transistor 404 may remain in a conductive state, coupling inverter 420 to voltage rail 406. Accordingly, bypass transistor 404 may bypass operation of NOR2 419 by de-powering inverter 420.

Accordingly, example circuit design 401 may provide a NOR2 design cell that may be utilized in both multi-voltage and single-voltage implementations. In some implementations, a bypass signal may be input to the bypass transistor 404 in a single voltage domain deployment (e.g., where input signal lines 407, 408 are in the same voltage domain as voltage rail 406). For instance, bypass signal line 427 may be tied to voltage rail 406 in a single voltage domain implementation or tied to ground in a multi-voltage domain implementation employing voltage level shifting.

As another example, a bypass signal may be employed in multi-voltage implementations where voltage differences between the domains are sufficiently small (for instance, less than 400 mV). In some such implementations, bypass signal line 427 may be tied to voltage rail 406 to permanently bypass circuitry 403. In further implementations, bypass signal line 427 may be coupled to a generated signal line. For instance, circuit 401 may be employed in a multi-voltage domain with variable voltage differences (e.g., from different modes of operation, different environments, etc. . . . ). In such an implementation, logic may generate a bypass signal responsive to a voltage difference between domains being less than a designated threshold.

Figure 5:
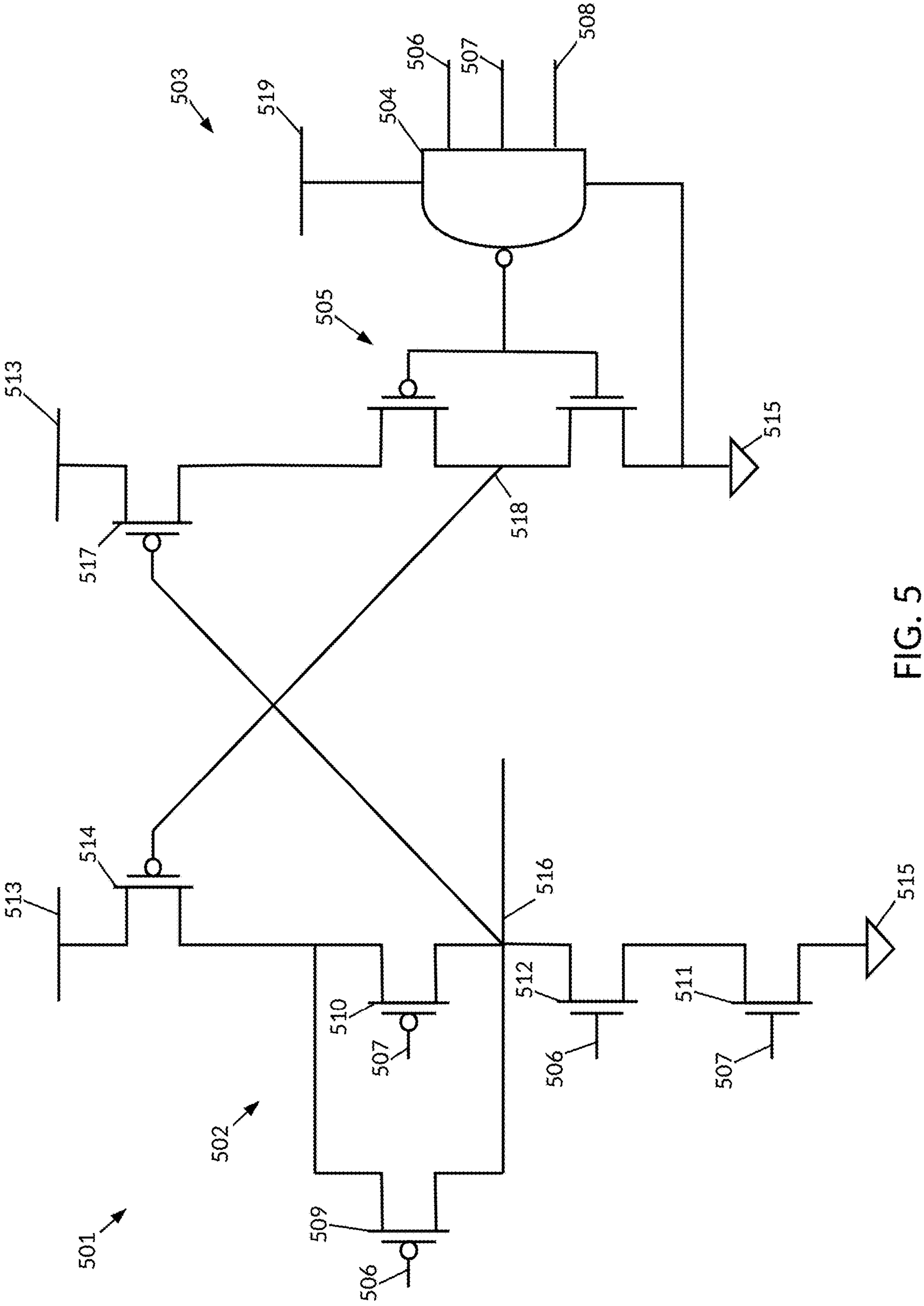
FIG. 5 illustrates another example apparatus including a logic gate circuit in accordance with an implementation.

Attention is now drawn to FIG. 5, which illustrates an example circuit 501 including first logic gate circuitry 502, second logic gate circuitry 503, and bypass circuitry 504. In particular, FIG. 5 illustrates an example circuit 501 where second logic gate circuitry 503 comprises an additional input 508 compared to first logic gate circuitry 502. In the illustrated implementation, first logic gate circuitry 502 may comprise a NAND2 gate 502 to perform a NAND operation on two input signals received via input signal lines 506, 507. In this implementation, second logic gate circuitry 503 may comprise a three-input AND (AND3) gate 503 connected to input signal lines 506, 507, and to a bypass signal line 508. In further implementations, example circuit 501 may comprise other logic gate circuitry 502 connected to a set of input lines 506, 507, and a complementary type logic gate circuitry 503 connected to input lines 506, 507 and a bypass input line 508.

In some implementations, logic gate circuitry 502 may be implemented as described with respect to logic gate circuitry 102 and/or 402. For example, as a NAND2 gate 502, circuitry 502 may comprise a first pair of cMOS transistors 509, 511 connected to first input signal line 506 and second pair of cMOS transistors 510, 512 connected to a second input signal line 507. In this example, pMOS transistors 509, 510 may be connected to a voltage rail 513 and output 516 in parallel and nMOS transistors 511, 512 may be connected to a Vcc rail 515 and output 516 in series. In some implementations, example circuit 501 may further comprise a first header transistor 514 and a second header transistor 517. For example, first header transistor 514 may switchably couple NAND2 502 to the voltage rail 513 responsive to signals received from a header control signal output 518 of AND3 503. In some implementations, header transistors 514, 517 may be implemented as described with respect to header transistors 111, 126, respectively.

As discussed above, in some implementations, logic gate circuitry 503 may be a complementary type compared to logic gate circuitry 502. For example, in the illustrated implementation, logic gate circuitry 502 may perform a Boolean NAND operation and logic gate circuitry 503 may perform a Boolean AND operation. In some implementations, complementary type logic gate 503 may have a differing number of inputs and/or may be connected to different input signal lines. For example, in the illustrated implementation, complementary type logic gate circuitry 503 may comprise a three input logic gate. For instance, complementary type logic gate circuitry 503 may comprise an AND3 gate 503. In the illustrated example, AND3 503 may comprise a NAND3 gate 504 having an output connected to an inverter 505. In further implementations, AND3 503 may be implemented via any suitable circuit. For instance, AND3 503 may be implemented via an input-inverted NOR circuit (e.g., AND circuitry 203 extended to 3 inputs).

In some implementations, bypass circuitry 508 may be implemented as an additional input to complementary logic gate circuit 503. For instance, as illustrated, bypass circuitry 508 may comprise an input to AND3 503. To bypass operation of level shifting circuitry 503, the bypass input 508 may be driven to place header control signal output 518 in a low state (e.g., to fix header transistor 514 in a conductive state). For example, in the illustrated example, a low-voltage bypass signal may bypass circuit 503 by fixing the output of AND(X,Y,0)=0 and a high voltage signal may provide level shifting operation by AND(X,Y,1)=AND(X, Y). For instance, input 508 may be connected to a high voltage source (e.g., voltage rail 519) for level shifting operation and may be connected to a low voltage sink (e.g., ground 515) for bypass operation.

Figure 6:
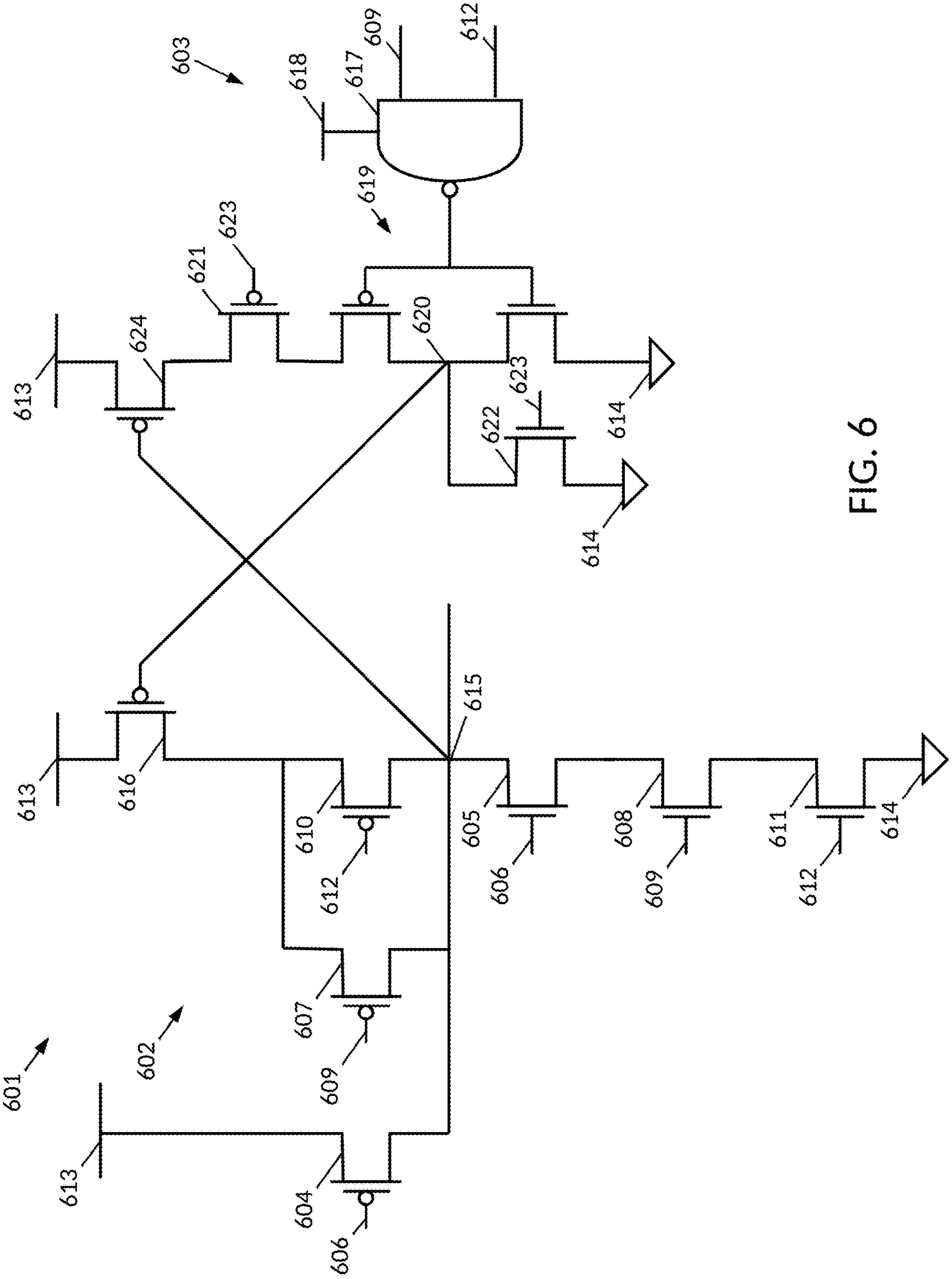
FIG. 6 illustrates another example apparatus including a logic gate circuit in accordance with an implementation.

Attention is now drawn to FIG. 6, which illustrates an example circuit 601 comprising a logic gate circuit 602 having a greater number of inputs than its complementary type logic gate circuit 603. In the illustrated example, logic gate circuit 602 comprises a NAND3 gate 602 and complementary type logic gate circuit 603 comprises an AND2 gate 603. In further implementations, logic gate circuit 602 may comprise any other Boolean logic gate 602 comprising a plurality of inputs and complementary gate circuit 602 may comprise a corresponding complementary type of Boolean logic gate 603 having fewer inputs than logic gate 602.

In some implementations, NAND3 602 may comprise a plurality of cMOS transistor pairs 604, 605; 607, 608; 610, 611 connected to input signal lines 606, 609, 612, respectively. As discussed above, in some implementations, signal lines 606, 609, 612 may be connected to a different (e.g., lower) voltage domain than voltage source 613. For example, NAND3 602 may comprise pMOS transistors 604, 607, 610 connected to a voltage source 613 and a signal output 615 in parallel and nMOS transistors 605, 608, 611 connected to signal output 615 and ground 614 in series.

Example circuit 601 may further comprise a header transistor 616 to switchably couple logic gate 602 to voltage source 613. In some implementations, a subset of inputs may be connected to voltage rail 613 in parallel to header transistor 613. For example, header transistor 616 may be connected to a first subset of input pMOS transistors 607, 610 while a second subset of input pMOS transistors 604 may be connected to voltage source 613 without being connected to header transistor 616. For instance, such an implementation may provide a relatively faster switching speed but a relatively higher signal loading than an implementation where all inputs are connected to a header transistor.

Example circuit 601 may further comprise a complementary type logic gate 603. In some implementations, logic gate 603 may comprise inputs corresponding to a subset 609, 612 of input signal lines 606, 609, 612 of logic gate 602. In further implementations, the subset of inputs may comprise the inputs of gate 602 connected to header transistor 616. For example, in the illustrated example, input pMOS 604 connected to signal line 606 is connected to voltage 612 in parallel to header transistor 616, while input pMOS 607, 610 (connected to signal lines 609, 612, respectively) are connected to header transistor 616 in series. Accordingly, logic gate 603 may comprise inputs for signal lines 609, 612 and may lack an input for signal line 606. In the illustrated example, logic gate 603 may comprise an AND gate as a complementary gate type to NAND gate 602. However, in this example, logic gate 603 has two inputs and comprises an AND2 gate 603 while logic gate 603 has three inputs and comprises a NAND3 gate 602. For example, AND2 603 may comprise a NAND2 gate 617 connected to input signal lines 609, 612 and an inverter 619 connected to the output of NAND2 617 and a header control signal output 620 (e.g., to implement an AND2 operation as described with respect to FIG. 1). In further examples, AND2 603 may be implemented in any suitable manner, such as, e.g., as described with respect to AND2 203 of FIG. 2.

Logic gate circuit 603 may further comprise a header transistor 624 to switchably couple circuit 603 to voltage rail 613. As discussed above, in some cases, header transistor 624 may connect to a portion of logic gate 603 and the other portion may have a parallel connection to rail 613 or be connected to a rail 618 in a different voltage domain (e.g., in the same voltage domain as input signal lines 606, 609, 612. For instance, as illustrated, header transistor 624 gates power to inverter 619 while NAND2 617 is powered separately via voltage rail 618.

During operation, header control signal output 620 may output a control signal to header transistor 616 based on a Boolean AND operation performed on signals received via lines 609, 612. Accordingly, gate 603 may control voltage to the portion 607, 610 of gate 602 that is connected to voltage rail 613. In comparison, signal output 615, which controls header transistor 624, may be based on a Boolean NAND operation performed on signals received via lines 606, 609, and 612. Accordingly, signals received via line 606 may influence operation of logic gate circuit 603 despite not having a corresponding input. For example, a signal combination of (0, 1, 1) (ordered 606, 609, 612) may result in a high voltage signal at output 615 (e.g., NAND(0, 1, 1)=1), which may decouple inverter 619 from voltage rail 613 by placing header transistor 624 in a non-conductive state. Continuing the example, the same signal combination would result in a high voltage (e.g., AND(1,1)=1) at header control output 620 if gate 603 were connected to voltage. However, in this example, output signal 615 has decoupled gate 603 from voltage rail 613, placing output 620 in a low voltage, which may place header transistor 616 in a conductive state.

As a further example, a signal combination of (1,1,1) may result in a low voltage signal at output 615 (e.g., NAND(1, 1,1)=0). The low voltage signal may place header transistor 624 in a conductive state. Continuing this example, the same signal combination may result in a high voltage signal at output 620 (e.g., AND(1,1)=1), decoupling transistors 607, 610 from voltage rail 613.

In some implementations, example circuit 601 may further comprise bypass circuitry 621, 622 connected to a bypass signal line 623. In the illustrated example, bypass circuitry 621, 622 may comprise a pair of CMOS transistors with gates connected to bypass signal line 623. In some cases, pMOS bypass transistor 621 may be connected to header transistor 624 and inverter 619 in series. In further cases, pMOS bypass transistor 621 may be connected to voltage rail 613 and header transistor 624 in series. In this example, nMOS bypass transistor 622 may be connected to header control output 620 in parallel to inverter 619. For example, bypass signal line 623 may be set to low voltage for level shifting operation and high voltage for bypassed operation. For instance, bypass signal line 623 may be tied to a voltage rail (e.g., rail 613) in a single domain implementation (or implementations having sufficiently low voltage differences between domains).

Figure 7:
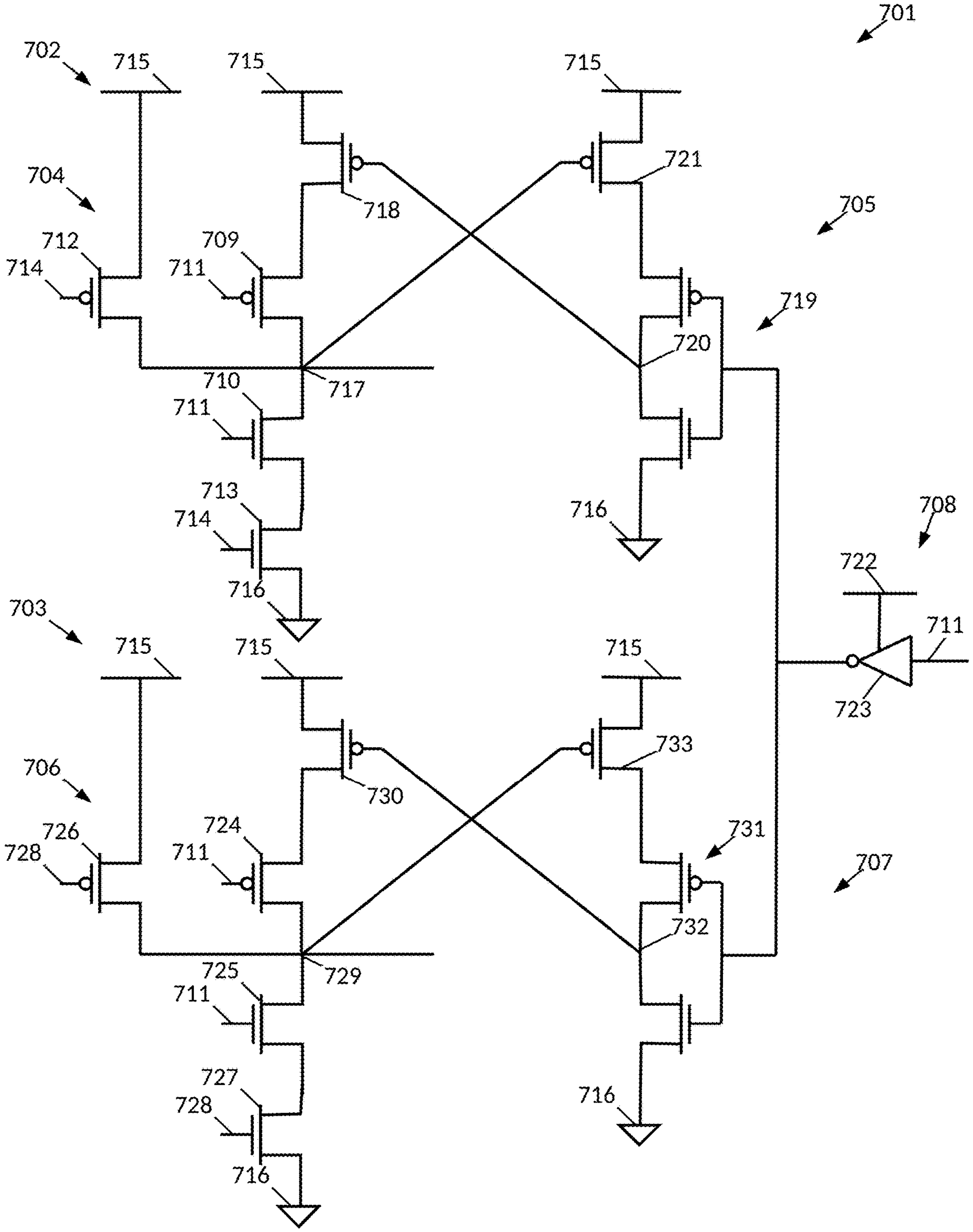
FIG. 7 illustrates another example apparatus including a logic gate circuit in accordance with an implementation.

Attention is now drawn to FIG. 7, which illustrates an example circuit 701 comprising first level shifting circuitry 702 and second level shifting circuitry 703 comprising a shared circuit portion 708. In this example, level shifting circuitry 702 may comprise a first logic gate 704 and a first complementary type logic gate 705, 708. Similarly, level shifting circuitry 703 may comprise a second logic gate 706 and a second complementary type logic gate 707, 708. For example, the first and second complementary logic gates 705, 707 may share input circuitry 708 as described with respect to FIG. 3. Additionally, first and second complementary logic gates 705, 707, 708 may have fewer inputs than their corresponding logic gates 704, 706, as discussed with respect to FIG. 6.

In some implementations, logic gate circuit 704 may comprise a plurality of input signal lines 711, 714 connected to input transistors 709, 710; 712, 713, respectively. In some implementations, a subset of the input transistors 709 may be connected to a voltage source 715 via an in-series connection to a header transistor 718 and the complement subset of input transistors 712 may be connected to voltage source 715 separately (e.g. in parallel) from header transistor 718. For example, the illustrated implementation may comprise a NAND2 gate 704 comprising a first cMOS pair 709, 710 connected to signal line 711 and a second cMOS pair 712, 713 connected to signal line 714.

Similarly, logic gate circuit 706 may comprise a plurality of input signal lines 711, 728 connected to input transistors 724, 725; 726, 727, respectively. Further, a subset of input transistors 709 may be connected to voltage source 715 in series with a header transistor 730 while the complement subset 726 may be connected to voltage source 715 in parallel to header transistor 730. As illustrated, logic gate circuit 706 may comprise a NAND2 gate 706 comprising a first cMOS pair 724, 725 connected to signal line 711 and a second cMOS pair 712, 713 connected to signal line 726.

As described above, in some examples, the inputs to complementary type logic gates 705, 707, 708 may correspond to the logic gate inputs 709, 724 that are connected to header transistors 718, 730. Additionally, portions 708 of complementary gate input circuitry corresponding to shared signal lines 711 may be shared between circuits 702, 703. For example, in the illustrated implementation, NAND2 gates 704, 706 each have a single input 709, 724 connected to header transistors 718, 730. Accordingly, complementary type logic gates 705, 707 may comprise single-input AND gates (e.g., that implement an AND(X,X)=X, or identity Boolean function). For example, complementary type logic gates 705, 707, 708 may comprise a first inverter 723 having an input connected to signal line 711 and an output connected to second inverters 718, 731 (e.g., a Boolean NOT (NOT(X))=X function). In some implementations, shared inverter 723 may be connected to a second voltage domain 722, such as the same domain as signal line 711. Accordingly, shared signal line 711 may be protected from excess loading via header transistors 718, 721, 730, 733, while unshared signal lines 714, 718 drive pMOS transistors 712, 726 directly.

Figure 8:
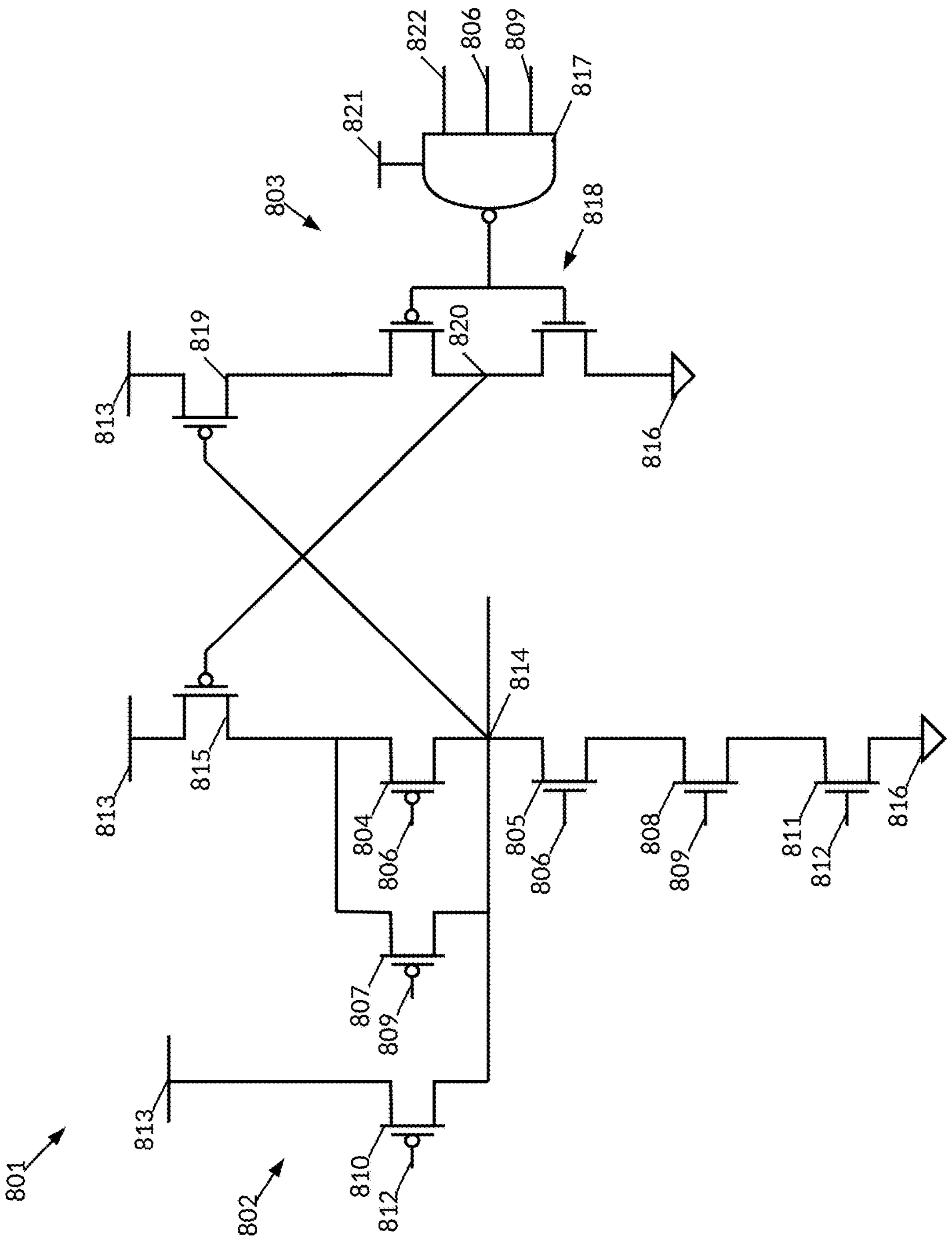
FIG. 8 illustrates another example apparatus including a logic gate circuit in accordance with an implementation.

Attention is now drawn to FIG. 8, which illustrates an example circuit 801 comprising logic gate circuitry 802 comprising split-loaded inputs as described with respect to FIGS. 6,7 and bypass circuitry 817, 822 comprising a complementary type gate input as described with respect to FIG. 5. In the illustrated example, logic gate 802 may comprise a NAND3 gate 802 connected to three input signal lines 806, 809, 812. For example, NAND3 gate 802 may comprise three cMOS transistor pairs 804, 805; 807, 808; 810, 811 connected to a signal output 815. In this example, a first pair of pMOS transistors 804, 807 are connected to a header transistor 814 and output 815 in series while pMOS transistor 810 is connected to voltage source 813 in parallel to header transistor 814. For instance, NAND3 gate 802 may be implemented as described with respect to FIG. 6.

As discussed above, a logic gate 802 and its complementary type gate 803 may have the same number of inputs but may be connected to different signal lines. In some implementations, complementary type gate 803 may comprise signal inputs connected to signal lines 806, 809, corresponding to gate 802 inputs 804, 807 connected to header transistor 814. In further implementations, complementary type gate 803 may include an input connected to a bypass signal line 822. For instance, in the illustrated implementation, complementary type gate 803 may comprise an AND3 gate 803 connected to input signal lines 822, 806, 809. As an example, complementary type gate 803 may comprise a NAND3 gate 817 having an output connected to inverter 818, where output 820 of inverter 818 is connected to the gate of header transistor 814. In some implementations, NAND3 817 may be powered in a different voltage domain 821 than inverter 818. In further implementations, the two circuits 817 may be in the same domain (e.g., connected to the same voltage rail 813). In this example, a low voltage on bypass signal line 822 may fix the output 820 in a low voltage state (e.g., AND(X,Y,0)=0 for all X, Y) while a high voltage on bypass signal line 822 may provide active level shifting operation (e.g., AND(X,Y,1)=AND(X,Y)).

Figure 9:
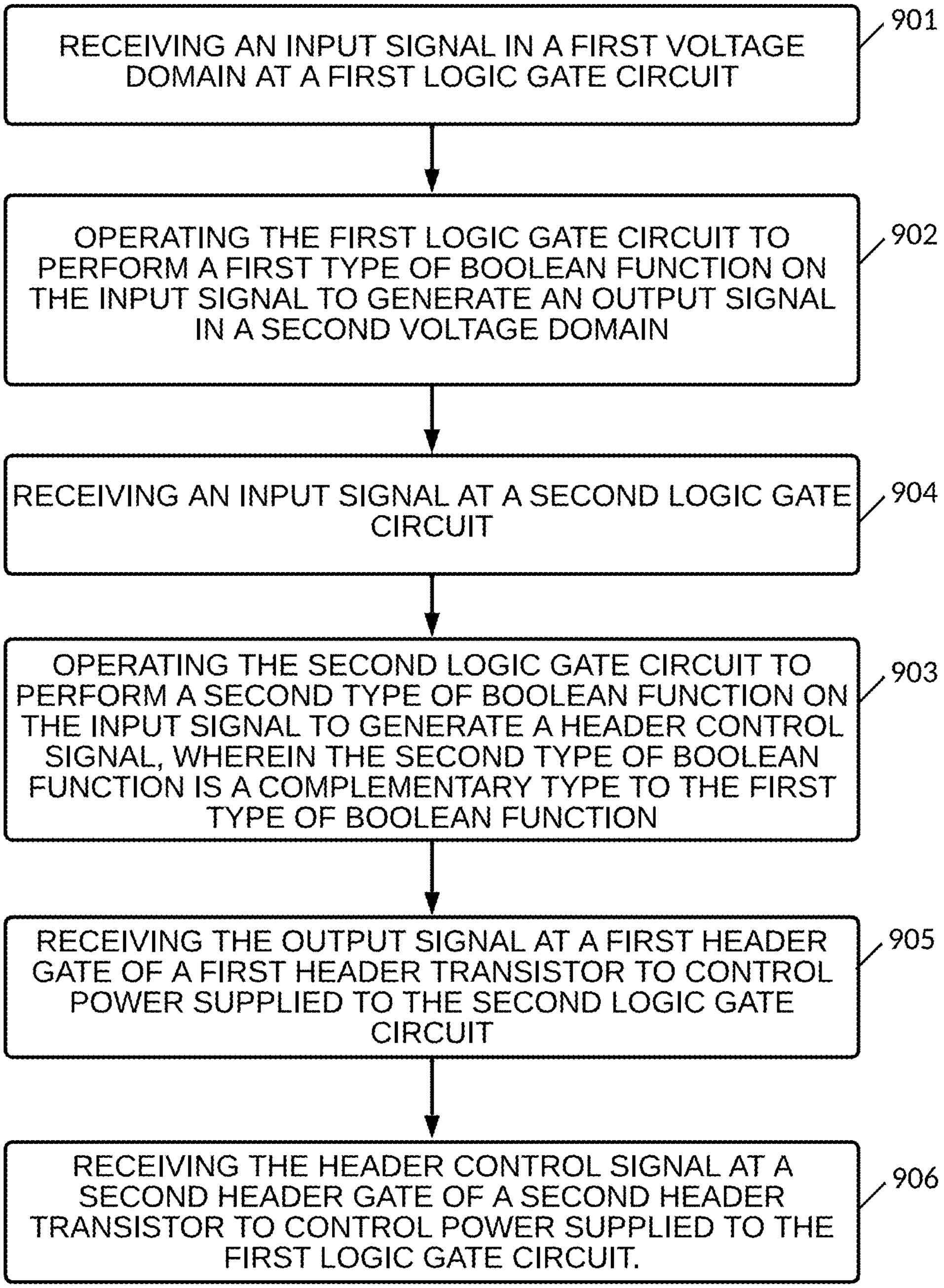
FIG. 9 illustrates an example method of operating an apparatus in accordance with an implementation.

Attention is now drawn to FIG. 9, which is a flow diagram illustrating a method of operating a circuit. For instance, in some implementations, any example circuit described with respect to FIGS. 1-8 may be operated as illustrated.

In some implementations, the example method may include operation 901, which may include receiving an input signal in a first voltage domain at a first logic gate circuit. For example, the first logic gate circuit may comprise a logic gate circuit such as circuit 102 of FIG. 1, circuit 202 of FIG. 2, circuits 304, 306 of FIG. 3, circuit 402 of FIG. 4, circuit 502 of FIG. 5, circuit 602 of FIG. 6, circuit 705, 706 of FIG. 7, circuit 802 of FIG. 8, and/or like logic gate circuitry. In some implementations, operation 901 may include receiving an input signal at an input connected to a voltage source in series with a header transistor. For instance, operation 901 may include receiving an input signal via a signal line such as 108, 109; 208, 209; 313, 316, 321; 407, 408; 506, 507; 609, 612; 711; 806, 809; and/or the like. In further implementations, operation 901 include receiving an input signal at an input connected to a voltage source in parallel with a header transistor. For instance, operation 901 may include receiving an input signal via a signal line such as 606; 714, 728; 812, and/or the like.

In some implementations, the example method may further include operation 902, which may include operating the first logic gate circuit to perform a first type of Boolean function on the input signal to generate an output signal in a second voltage domain. For example, operation 902 may comprise performing NAND, NOR, OR, AND, OR-AND Invert (OAI), AND-OR-Invert (AOI), XOR, XNOR operations, combinations thereof, and/or the like. In some implementations, the second voltage domain may be different from the first voltage domain. For instance, the first voltage domain may be a lower voltage than the second voltage domain. In further implementations, the second voltage domain may be the same domain as the first voltage domain.

In some implementations, the example method may further include operation 903, which may include receiving an input signal at a second logic gate circuit. For example, operation 903 may comprise receiving the input signal at a logic gate circuit as described with respect to circuits 103; 203; 305, 307, 308; 403; 503; 603; 705, 708, 707; 803; and/or the like. In some implementations, operation 903 may comprise receiving input signals corresponding to inputs of the first gate that are connected to a header transistor as described with respect to the preceding figures. In some such implementations, these input signals may correspond to a subset of the input signals received by the first logic gate in operation 901. For instance, the subset of input signals may correspond to input signal lines connected to inputs connected to a header transistor, such as described with respect to FIGS. 6-8. In some implementations, operation 903 may further include receiving a bypass signal at the second logic gate circuit, such as described with respect to FIGS. 4, 5, 6, and 8.

In some implementations, the example method may further include operation 904, which may include operating the second logic gate circuit to perform a second type of Boolean function on the input signal to generate a header control signal, wherein the second type of Boolean function is a complementary type to the first type of Boolean function. In various implementations, operation 904 may be performed as described with respect to the operation of any of the preceding examples. For example, operation 904 may comprise performing an AND operation as a complementary type to a NAND operation performed in operation 902. As further example, operation 904 may comprise performing an OR operation to complement a NOR operation, a NAND operation to complement an AND operation, and so on.

In some implementations, operation 904 may comprise performing the complementary type Boolean operation on differing inputs than the Boolean operation performed in operation 902. In some cases, operation 904 may comprise performing the Boolean operation on fewer input signals, such as described with respect to FIGS. 6 and 7. As another example, operation 904 may comprise performing the operation on additional signals, such as a bypass signal as described with respect to FIGS. 5 and 8. For instance, operation 904 may comprise operating the second logic gate to perform the second type of Boolean function on the input signal and the bypass signal to output a header control signal in a steady state, such as a steady low-voltage state. For example, operation 904 may comprise performing an AND operation on the input signal and a steady state low voltage bypass signal to generate a steady low voltage output signal.

In further implementations, operation 904 may further comprise decoupling the second logic gate circuit from a power rail to set the header control signal to a steady state. For example, the header control signal may place a header transistor in a steady conducting state. For instance, operation 904 may comprise receiving a high-voltage bypass signal at a bypass transistor such as bypass transistor 404 of FIG. 4 and/or bypass transistors 621, 622 of FIG. 6.

In some implementations, the example method may further include operation 905, which may comprise receiving the output signal generated in operation 902 at a first header gate of a first header transistor to control power supplied to the second logic gate circuit. For example, operation 905 may be performed as described with output 125, 225, 309, 310, 417, 516, 615, 717, 729 and/or 815 and header transistor 126, 226, 338, 340, 426, 517, 624, 721, 733, and/or 819, respectively. In some implementations, operation 905 may comprise controlling power to a portion of the second logic gate. For instance, a first portion of the second logic gate may be connected to a voltage source in parallel to the first header transistor or connected to a second voltage domain.

In some implementations, the example method may further include operation 906, which may comprise receiving the header control signal generated in operation 904 at a second header gate of a second header transistor to control power supplied to the first logic gate circuit. For example, operation 906 may be performed as described with respect to header control signal output 124, 224, 331, 341, 425, 518, 620, 720, 732, and/or 820 and header transistor 111, 211, 337, 339, 405, 514, 616, 718, 730, and/or 814, respectively.

Figure 10:
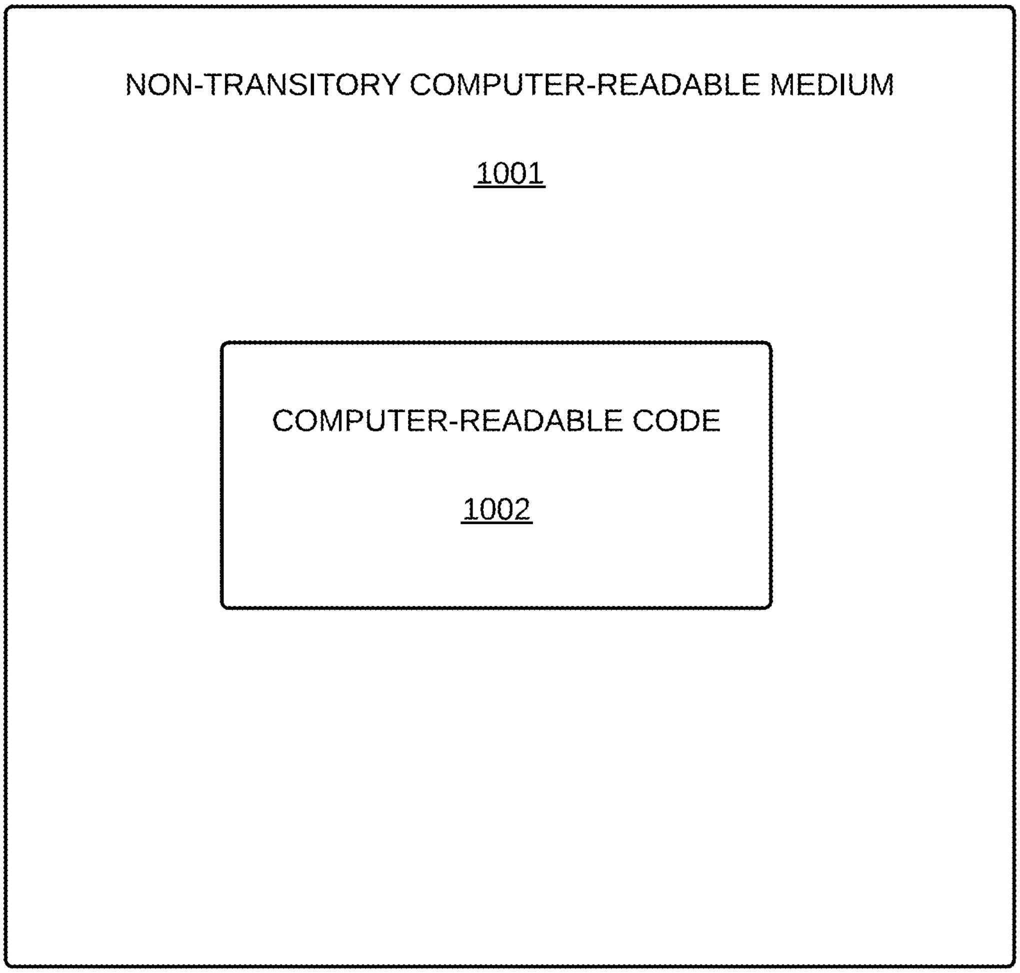
FIG. 10 illustrates an example non-transitory computer-readable medium comprising computer-readable code for a design of an apparatus in accordance with an implementation.

Attention is now drawn to FIG. 10, which illustrates an example of a non-transitory computer-readable medium 1001 comprising computer-readable code 1002. Concepts described herein may be embodied in computer-readable code 1002 for fabrication of an apparatus that embodies the described concepts. For example, the computer-readable code 1002 can be used at one or more stages of a semiconductor design and fabrication process, including an electronic design automation (EDA) stage, to fabricate an integrated circuit comprising the apparatus embodying the concepts. The above computer-readable code 1002 may additionally or alternatively enable the definition, modelling, simulation, verification and/or testing of an apparatus embodying the concepts described herein.

For example, the computer-readable code 1002 for fabrication of an apparatus embodying the concepts described herein can be embodied in code 1002 defining a hardware description language (HDL) representation of the concepts. For example, the code 1002 may define a register-transfer-level (RTL) abstraction of one or more logic circuits for defining an apparatus embodying the concepts. The code 1002 may define a HDL representation of the one or more logic circuits embodying the apparatus in Verilog, System Verilog, Chisel, or VHDL (Very High-Speed Integrated Circuit Hardware Description Language) as well as intermediate representations such as FIRRTL. Computer-readable code 1002 may provide definitions embodying the concept using system-level modelling languages such as SystemC and System Verilog or other behavioural representations of the concepts that can be interpreted by a computer to enable simulation, functional and/or formal verification, and testing of the concepts.

Additionally or alternatively, the computer-readable code 1002 may define a low-level description of integrated circuit components that embody concepts described herein, such as one or more netlists or integrated circuit layout definitions, including representations such as GDSII. The one or more netlists or other computer-readable representation of integrated circuit components may be generated by applying one or more logic synthesis processes to an RTL representation to generate definitions for use in fabrication of an apparatus embodying the invention. Alternatively or additionally, the one or more logic synthesis processes can generate from the computer-readable code 1002 a bitstream to be loaded into a field programmable gate array (FPGA) to configure the FPGA to embody the described concepts. The FPGA may be deployed for the purposes of verification and test of the concepts prior to fabrication in an integrated circuit or the FPGA may be deployed in a product directly.

The computer-readable code 1002 may comprise a mix of code 1002 representations for fabrication of an apparatus, for example including a mix of one or more of an RTL representation, a netlist representation, or another computer-readable definition to be used in a semiconductor design and fabrication process to fabricate an apparatus embodying the invention. Alternatively or additionally, the concept may be defined in a combination of a computer-readable definition to be used in a semiconductor design and fabrication process to fabricate an apparatus and computer-readable code 1002 defining instructions which are to be executed by the defined apparatus once fabricated.

Such computer-readable code 1002 can be disposed in any known transitory computer-readable medium (such as wired or wireless transmission of code over a network) or non-transitory computer-readable medium 1001 such as semiconductor, magnetic disk, or optical disc. An integrated circuit fabricated using the computer-readable code 1002 may comprise components such as one or more of a central processing unit, graphics processing unit, neural processing unit, digital signal processor or other components that individually or collectively embody the concept.

Unless otherwise indicated, in the context of the present disclosure, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Furthermore, the terms "first," "second" "third," and the like are used to distinguish different aspects, such as different components, as one example, rather than supplying a numerical limit or suggesting a particular order, unless expressly indicated otherwise. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated.

In the preceding description, various aspects of claimed subject matter have been described. For purposes of explanation, specifics, such as amounts, systems and/or configurations, as examples, were set forth. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all modifications and/or changes as fall within claimed subject matter.

Some configurations of the present techniques are described by the following numbered clauses:

Clause 1. A circuit, comprising:

a first logic gate circuit to implement a first type of Boolean function and comprising a first input connected to an input signal line and a first output connected to an output signal line, wherein the input signal line is in a first voltage domain and the output signal line is in a second voltage domain;

a second logic gate circuit to implement a second type of Boolean function and comprising a second input connected to the input signal line and a second output connected to a header control signal line, wherein the second type of Boolean function is a complementary type to the first type of Boolean function;

a first header transistor to switchably couple an output voltage rail to the first logic gate circuit via a first header gate connected to the header control signal line, wherein the output voltage rail is in the second voltage domain; and a second header transistor to switchably couple the output voltage rail to the second logic gate circuit via a second header gate connected to the output signal line.

Clause 2. The circuit of clause 1, wherein:

the first logic gate circuit comprises a first plurality of inputs connected to a corresponding plurality of input signal lines, the first plurality of inputs including the first input; and the second logic gate circuit comprises a second plurality of inputs connected to a corresponding subset of the plurality of input signal lines, the subset including the first input signal line.

Clause 3. The circuit of any preceding clauses, wherein an input connected to a signal line distinct from the corresponding subset of the plurality of input signal lines comprises an input transistor connected to the output voltage rail in parallel to the first header transistor.

Clause 4. The circuit of any preceding clauses, further comprising a bypass transistor comprising a bypass gate connected to a bypass signal line, the bypass transistor connected to the second header transistor to decouple the second header transistor from the second logic gate circuit based on a bypass signal received via the bypass signal line.

Clause 5. The circuit of any preceding clauses, further comprising:

a second bypass transistor comprising a second bypass gate connected to the bypass signal line, the second bypass transistor connected to the second logic gate circuit and a low voltage (Vss) rail to couple the header control signal line to the Vss rail based at least in part on the bypass signal.

Clause 6. The circuit of any preceding clauses, wherein the second logic gate circuit comprises:

a third logic gate circuit to implement the first type of function and comprising the second input and a third output; and an inverter circuit comprising the second output and an inverter input connected to the third output, wherein the third logic gate circuit is connected to the first voltage domain and the inverter circuit is connected to the second voltage domain.

Clause 7. The circuit of any preceding clauses, wherein:

the first logic gate circuit comprises a first NAND gate comprising a first plurality of inputs connected to a corresponding plurality of input signal lines, the first plurality of inputs including the first input; and the second logic gate circuit comprises a second NAND gate comprising:

a second plurality of inputs connected to the corresponding plurality of input signal lines, the second plurality of inputs including the second input, and a bypass input connected to a bypass signal line.

Clause 8. The circuit of any preceding clauses, wherein:

the first logic gate circuit comprise a NAND gate connected to a plurality of input signal lines; and the second logic gate circuit comprises a plurality of inverters connected to the plurality of input signal lines and a NOR gate connected to the plurality of inverters.

Clause 9. The circuit of any preceding clauses, the second logic gate circuit further comprises a bypass input to fix the output of the second logic gate circuit to a value that controls the first header transistor to decouple the output voltage rail from the first logic gate circuit.

Clause 10. The circuit of any preceding clauses, further comprising:

a third logic gate circuit to implement the first type of Boolean function and comprising a third input connected to the input signal line and a third output connected to a second output signal line;

a fourth logic gate circuit to implement the second type of Boolean function and comprising the second input connected to the input signal line and a fourth output connected to a second header control signal line;

a third header transistor to switchably couple the output voltage rail to the third logic gate circuit via a third header gate connected to the second header control signal line; and a fourth header transistor to switchably couple the output voltage rail to the fourth logic gate circuit via a fourth header gate connected to the second output signal line.

Clause 11. A method, comprising:

receiving an input signal in a first voltage domain at a first logic gate circuit;

operating the first logic gate circuit to perform a first type of Boolean function on the input signal to generate an output signal in a second voltage domain;

receiving the input signal at a second logic gate circuit;

operating the second logic gate circuit to perform a second type of Boolean function on the input signal to generate a header control signal, wherein the second type of Boolean function is a complementary type to the first type of Boolean function;

receiving the output signal at a first header gate of a first header transistor to control power supplied to the second logic gate circuit; and receiving the header control signal at a second header gate of a second header transistor to control power supplied to the first logic gate circuit.

Clause 12. The method of clause 11, further comprising:

receiving a bypass signal at the second logic gate circuit;

based on the bypass signal, setting the header control signal to a steady state to fix the first header transistor in a conducting state.

Clause 13. The method of clauses 11-12, further comprising:

operating the second logic gate to perform the second type of Boolean function on the input signal and the bypass signal to output the header control signal in the steady state.

Clause 14. The method of clauses 11-13, further comprising:

receiving the bypass signal at a bypass transistor to decouple the second logic gate circuit from a power rail to set the header control signal to the steady state.

Clause 15. The method of clauses 11-14, further comprising: receiving the bypass signal at a second bypass transistor to couple the second logic gate circuit to a low voltage rail to set the header control signal to the steady state.

Clause 16. The method of clauses 11-15, further comprising:

operating the first logic gate circuit in the second voltage domain;

operating a first portion of the second logic gate circuit in the first voltage domain; and operating a second portion of the second logic gate circuit in the second voltage domain.

Clause 17. The method of clauses 11-16, further comprising:

operating the first portion of the second logic gate circuit to perform the first type of type of Boolean function on the input signal;

operating the second portion of the second logic gate circuit to invert an output of the first portion of the second logic gate circuit to generate the header control signal in the second voltage domain.

Clause 18. The method of clauses 11-17, further comprising:

receiving the first input signal at a first input transistor in series with the first header transistor;

receiving a second input signal in the first voltage domain at a second input transistor in parallel with the first header transistor.

Clause 19. The method of clauses 11-18, further comprising:

receiving the input signal at a third logic gate circuit comprising a second signal output; and receiving the input signal at a fourth logic gate circuit comprising a second header control signal output, wherein receiving the input signal at the fourth logic gate circuit comprises receiving the input signal at a shared input connected to the second and fourth logic gate circuits.

Clause 20. A non-transitory computer-readable medium storing computer-readable code for the fabrication of the apparatus of any of clauses 1-10.

What is claimed is:

1. A circuit, comprising:

a first logic gate circuit to implement a first type of Boolean function and comprising a first input terminal connected to an input signal line and a first output terminal connected to an output signal line, wherein the input signal line is in a first voltage domain and the output signal line is in a second voltage domain, the first logic gate circuit comprising;

a first logic function circuit coupled to the input signal line and further coupled between the first output terminal and a reference voltage; and a second logic function circuit coupled to the input signal line and further complementary to the first logic function circuit and coupled between the first output terminal and a first header transistor;

a second logic gate circuit to implement a second type of Boolean function and comprising a second input terminal connected to the input signal line and a second output terminal connected to a header control signal line, wherein the second type of Boolean function is a complementary type to the first type of Boolean function, the second logic gate circuit comprising;

a third logic function circuit coupled to the input signal line and further coupled between the second output terminal and the reference voltage, the third logic function circuit identical to the first logic function circuit; and a fourth logic function circuit coupled to the input signal line and further complementary to the third logic function circuit and coupled between the second output terminal and a second voltage rail, the fourth logic function circuit identical to the second logic function circuit;

the first header transistor to switchably couple an output voltage rail to the first logic gate circuit via a first header gate connected to the header control signal line, wherein the output voltage rail is in the second voltage domain; and a second header transistor to switchably couple the output voltage rail to the second logic gate circuit via a second header gate connected to the output signal line.

2. The circuit of claim 1, wherein:

the first logic gate circuit comprises a first plurality of input terminals connected to a corresponding plurality of input signal lines, the first plurality of input terminals including the first input terminal; and the second logic gate circuit comprises a second plurality of input terminals connected to a corresponding subset of the plurality of input signal lines.

3. The circuit of claim 2, wherein an input connected to a signal line distinct from the corresponding subset of the plurality of input signal lines comprises an input transistor connected to the output voltage rail in parallel to the first header transistor.

4. The circuit of claim 3, further comprising a bypass transistor comprising a bypass gate connected to a bypass signal line, the bypass transistor connected to the second header transistor to decouple the second header transistor from the second logic gate circuit based on a bypass signal received via the bypass signal line.

5. The circuit of claim 4, further comprising:

a second bypass transistor comprising a second bypass gate connected to the bypass signal line, the second bypass transistor connected to the second logic gate circuit and a low voltage (Vss) rail to couple the header control signal line to the Vss rail based at least in part on the bypass signal.

6. The circuit of claim 1, wherein the second logic gate circuit comprises:

a third logic gate circuit to implement the first type of function and comprising the second input terminal and a third output terminal; and an inverter circuit comprising the second output terminal and an inverter input terminal connected to the third output terminal, wherein the third logic gate circuit is connected to the first voltage domain and the inverter circuit is connected to the second voltage domain.

7. The circuit of claim 6, wherein:

the first logic gate circuit comprises a first NAND gate comprising a first plurality of input terminals connected to a corresponding plurality of input signal lines, the first plurality of input terminals including the first input terminal; and the second logic gate circuit comprises a second NAND gate comprising:

a second plurality of input terminals connected to the corresponding plurality of input signal lines, the second plurality of input terminals including the second input terminal; and a bypass input terminal connected to a bypass signal line.

8. The circuit of claim 1, wherein:

the first logic gate circuit comprise a NAND gate connected to a plurality of input signal lines; and the second logic gate circuit comprises a plurality of inverters connected to the plurality of input signal lines and a NOR gate connected to the plurality of inverters.

9. The circuit of claim 1, the second logic gate circuit further comprises a bypass input terminal to set the header control signal line to a voltage that controls the first header transistor to decouple the output voltage rail from the first logic gate circuit.

10. The circuit of claim 1, further comprising:

a third logic gate circuit to implement the first type of Boolean function and comprising a third input terminal connected to the input signal line and a third output terminal connected to a second output signal line;

a fourth logic gate circuit to implement the second type of Boolean function and comprising the second input terminal connected to the input signal line and a fourth output terminal connected to a second header control signal line;

a third header transistor to switchably couple the output voltage rail to the third logic gate circuit via a third header gate connected to the second header control signal line; and a fourth header transistor to switchably couple the output voltage rail to the fourth logic gate circuit via a fourth header gate connected to the second output signal line.

11. A method, comprising:

receiving a first input signal in a first voltage domain at a first logic gate circuit, the first logic gate circuit comprising:

a first logic function circuit coupled to the first input signal and further coupled between a first output terminal and a reference voltage; and a second logic function circuit coupled to the first input signal and further complementary to the first logic function circuit and coupled between the first output terminal and a first header transistor;

operating the first logic gate circuit to perform a first type of Boolean function on the first input signal to generate an output signal in a second voltage domain;

receiving the first input signal at a second logic gate circuit, the second logic gate circuit comprising:

a third logic function circuit coupled to the first input signal and further coupled between a second output terminal and the reference voltage, the third logic function circuit identical to the first logic function circuit; and a fourth logic function circuit coupled to the first input signal and further complementary to the third logic function circuit and coupled between the second output terminal and a second voltage rail, the fourth logic function circuit identical to the second logic function circuit;

operating the second logic gate circuit to perform a second type of Boolean function on the first input signal to generate a header control signal, wherein the second type of Boolean function is a complementary type to the first type of Boolean function;

receiving the output signal at a first header gate of the first header transistor to control power supplied to the second logic gate circuit; and receiving the header control signal at a second header gate of a second header transistor to control power supplied to the first logic gate circuit.

12. The method of claim 11, further comprising:

receiving a bypass signal at the second logic gate circuit; and based on the bypass signal, setting the header control signal to a steady state to fix the first header transistor in a conducting state.

13. The method of claim 12, further comprising:

operating the second logic gate circuit to perform the second type of Boolean function on the first input signal and the bypass signal to output the header control signal in the steady state.

14. The method of claim 12, further comprising:

receiving the bypass signal at a bypass transistor to decouple the second logic gate circuit from a power rail to set the header control signal to the steady state.

15. The method of claim 14, further comprising:

receiving the bypass signal at a second bypass transistor to couple the second logic gate circuit to a low voltage rail to set the header control signal to the steady state.

16. The method of claim 11, further comprising:

operating the first logic gate circuit in the second voltage domain;

operating a first portion of the second logic gate circuit in the first voltage domain; and operating a second portion of the second logic gate circuit in the second voltage domain.

17. The method of claim 16, further comprising:

operating the first portion of the second logic gate circuit to perform the first type of type of Boolean function on the first input signal; and operating the second portion of the second logic gate circuit to invert an output signal of the first portion of the second logic gate circuit to generate the header control signal in the second voltage domain.

18. The method of claim 11, further comprising:

receiving the first input signal at a first input transistor in series with the first header transistor; and receiving a second input signal in the first voltage domain at a second input transistor in parallel with the first header transistor.

19. The method of claim 11, further comprising:

receiving the first input signal at a third logic gate circuit comprising a second signal output terminal; and receiving the first input signal at a fourth logic gate circuit comprising a second header control signal output;

wherein receiving the first input signal at the fourth logic gate circuit comprises receiving the first input signal at a shared input terminal connected to the second and fourth logic gate circuits.

20. A non-transitory computer-readable medium storing computer-readable code for fabrication of an apparatus comprising:

a first logic gate circuit to implement a first type of Boolean function and comprising a first input terminal connected to an input signal line and a first output terminal connected to an output signal line, wherein the input signal line is in a first voltage domain and the output signal line is in a second voltage domain, the first logic gate circuit comprising:

a first logic function circuit coupled to the input signal line and further coupled between the first output terminal and a reference voltage; and a second logic function circuit coupled to the input signal line and further complementary to the first logic function circuit and coupled between the first output terminal and a first header transistor;

a second logic gate circuit to implement a second type of Boolean function and comprising a second input terminal connected to the input signal line and a second output terminal connected to a header control signal line, wherein the second type of Boolean function is a complementary type to the first type of Boolean function, the second logic gate circuit comprising:

a third logic function circuit coupled to the input signal line and further coupled between the second output terminal and the reference voltage, the third logic function circuit identical to the first logic function circuit; and a fourth logic function circuit coupled to the input signal line and further complementary to the third logic function circuit and coupled between the second output terminal and a second voltage rail, the fourth logic function circuit identical to the second logic function circuit;

the first header transistor to switchably couple an output voltage rail to the first logic gate circuit via a first header gate connected to the header control signal line, wherein the output voltage rail is in the second voltage domain; and a second header transistor to switchably couple the output voltage rail to the second logic gate circuit via a second header gate connected to the output signal line.

* * * * *